(12) United States Patent
Horne

(10) Patent No.: US 12,550,230 B2
(45) Date of Patent: Feb. 10, 2026

(54) MULTI-LAYER SOLID-STATE HEATING ELEMENT

(71) Applicant: Inventheat, Inc., Provo, UT (US)

(72) Inventor: John Walter Horne, Provo, UT (US)

(73) Assignee: Inventheat, Inc., Provo, UT (US)

( * ) Notice: Subject to any disclaimer, the term of this patent is extended or adjusted under 35 U.S.C. 154(b) by 1218 days.

(21) Appl. No.: 17/359,013

(22) Filed: Jun. 25, 2021

(65) Prior Publication Data

US 2022/0418046 A1 Dec. 29, 2022

(51) Int. Cl.
 *H05B 3/14* (2006.01)
 *H05B 3/26* (2006.01)
 *H05B 3/34* (2006.01)

(52) U.S. Cl.
 CPC .............. *H05B 3/145* (2013.01); *H05B 3/26* (2013.01); *H05B 3/34* (2013.01); *H05B 2203/013* (2013.01)

(58) Field of Classification Search
 CPC .. H05B 3/34; H05B 1/0233; H05B 2203/005; H05B 2203/011; H05B 2203/013; H05B 2203/017; H05B 2203/02; H05B 2203/026; H05B 3/06; H05B 3/14; H05B 3/145; H05B 3/146; H05B 3/22; H05B 3/26; H05B 3/28; B32B 2307/202; B32B 7/12; H01L 21/67103; H01L 21/67109; H01L 21/67248; H01L 21/67259; H01L 21/6831
 USPC .................. 219/202, 490, 502, 528; 392/307
 See application file for complete search history.

(56) References Cited

U.S. PATENT DOCUMENTS

| 9,832,818 | B2 | 11/2017 | Decker et al. |
| 2012/0241440 | A1* | 9/2012 | Duncan ................... H05B 6/44 219/600 |
| 2018/0094434 | A1 | 4/2018 | Gillissen et al. |

FOREIGN PATENT DOCUMENTS

| CN | 111726899 | 10/2020 |
| CN | 111901908 A | 11/2020 |
| CN | 212511789 | 2/2021 |

OTHER PUBLICATIONS

Zhou, CN 109370370 (Year: 2019).*

* cited by examiner

*Primary Examiner* — Vy T Nguyen
(74) *Attorney, Agent, or Firm* — Jeffrey L. Ranck

(57) ABSTRACT

A novel solid-state heating element is disclosed. The heating element comprises a plurality of heating layers comprised of a mixture of carbon and a polymer or plastic. The heating layers are disposed on or infused into a substrate. Each heating layer can be disposed on, or infused into, its own substrate, or the heating layers can be disposed on or infused into opposites sides of the same substrate. A radiating element can be disposed in proximity to one or both of the heating layers. The radiating element absorbs the radiation put out by the heating layer(s) and reradiates heat. A heat transfer fluid such as air or a liquid can be directed across the radiating element and/or other areas of the heating element to transfer heat from the heating element to another location.

20 Claims, 15 Drawing Sheets

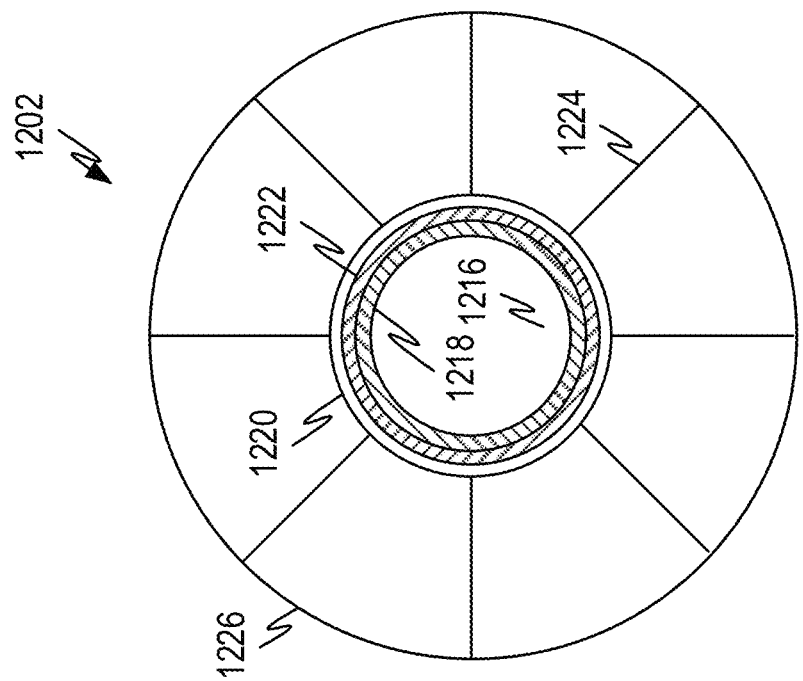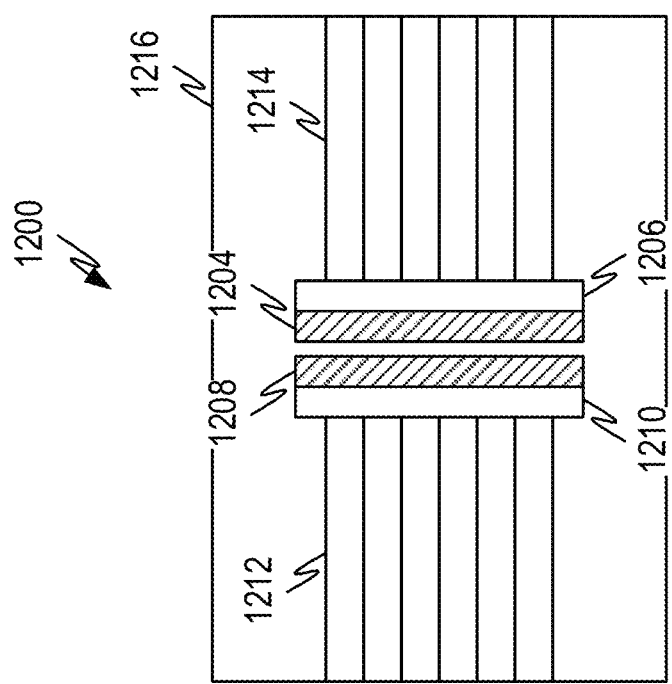
FIG. 12

MULTI-LAYER SOLID-STATE HEATING ELEMENT

FIELD

This application relates generally to heating systems for use in home and industrial applications. More specifically, this application relates to a solid-state heating element that can be incorporated into numerous applications.

BACKGROUND

Various methods have been developed to provide heat to buildings and for other applications. For example, current heating systems for buildings can include gas forced air, gas or oil boiler systems, heat pumps, electric, and other technologies. Heating for other applications can also use these technologies. In the case of buildings, current systems rely on generating heat at a single location and then moving the heat thorough a fluid (e.g., liquid or gas) to a more distant location to heat the entire building.

It is within this context that the present embodiments arise.

BRIEF DESCRIPTION OF DRAWINGS

FIG. 12 illustrates another example of an in-vent heating system incorporating a solid-state heating element according to some aspects of the present disclosure.

DETAILED DESCRIPTION

Figure 1:
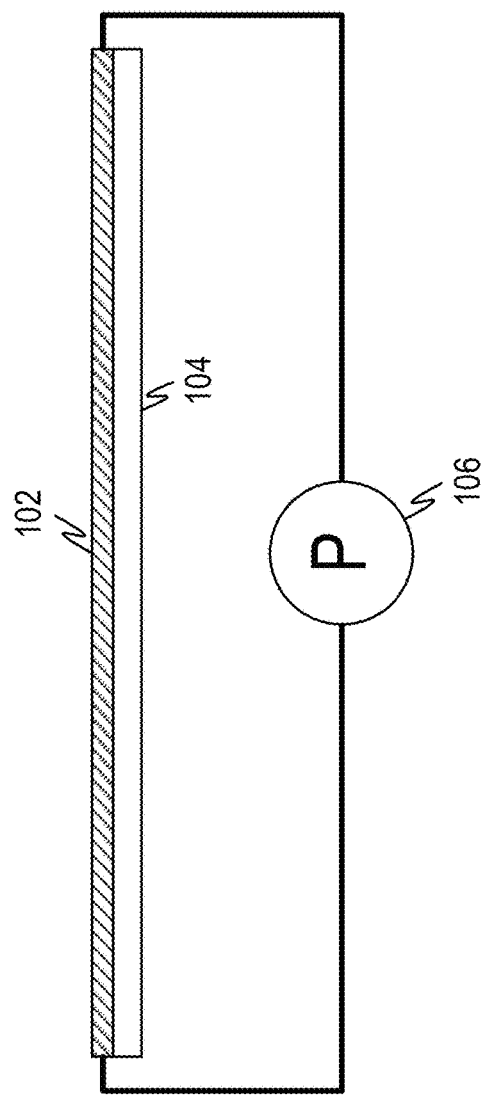
FIG. 1 illustrates a solid-state heating element according to the prior art.

The description that follows includes illustrative systems, methods, user interfaces, techniques, instruction sequences, and computing machine program products that exemplify illustrative embodiments. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. In general, well-known instruction instances, protocols, structures, and techniques have not been shown in detail.

Overview

The following overview is provided to introduce a selection of concepts in a simplified form that are further described below in the Description. This overview is not intended to identify key features or essential features of the claimed subject matter, nor is it intended to be used to limit the scope of the claimed subject matter. Its sole purpose is to present some concepts in a simplified form as a prelude to the more detailed description that is presented later.

As a preliminary matter, some of the figures describe concepts in the context of one or more structural components, variously referred to as functionality, modules, features, elements, or the like. The various components shown in the figures can be implemented in any manner, such as software, hardware, firmware, or combinations thereof. In some cases, various components shown in the figures may reflect the use of corresponding components in an actual implementation. In other cases, any single component illustrated in the figures may be implemented by a number of actual components. The depiction of any two or more separate components in the figures may reflect different functions performed by a single actual component.

For the logic described herein that illustrates how systems and heating elements can be controlled, certain operations are described as constituting distinct blocks performed in a certain order. Such implementations are examples and non-limiting. Certain blocks described herein can be grouped together and performed in a single operation, certain blocks can be broken apart into multiple component blocks, and certain blocks can be performed in an order that differs from that which is illustrated herein, including a parallel manner of performing the blocks. The blocks shown in the flowcharts can be implemented by software, hardware, firmware, manual processing, or the like. As used herein, hardware may include microprocessors, digital signal processors (DSPs), microcontrollers, computer systems, discrete logic components, and/or custom logic components such as field programmable gate arrays (FPGAs), application specific integrated circuits (ASICs), programmable logic arrays (PLAs) or the like.

As to terminology, the phrase "configured to" encompasses any way that any kind of functionality can be constructed to perform an identified operation. The functionality can be configured to perform an operation using, for example, software, hardware, firmware, or the like. For example, the phrase "configured to" can refer to a logic circuit structure of a hardware element that is arranged to implement the associated functionality. The phrase "configured to" can also refer to a logic circuit structure of a hardware element that is arranged to implement the coding design of associated functionality of firmware or software.

The term "module" refers to a structural element that can be implemented using any suitable hardware (e.g., a processor, among others), software (e.g., an application, among others), firmware, and/or any combination of hardware, software, and firmware. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," refers to a hardware component, such as a processing unit of a computer system.

Traditional heating systems typically rely on creating heat at a single location such as a boiler or gas fired furnace and then moving heat through pipes or ductwork to a location where the heat is delivered through a register or radiator. Such an approach is somewhat inefficient due to the heat loss that occurs along the way. For example, in a forced air system driven by a heat pump or gas fired furnace, the air coming out of a duct at a location remote from the furnace will be cold for some period of time before the warm air produced at the furnace warms the ductwork between the furnace and the register. Furthermore, as the warm air is carried through the ductwork, heat can be lost through radiation and air leakage from the ductwork into the surrounding spaces. While sealing the ductwork against leaks and insulating the ductwork can reduce heat loss, the fact remains that heat loss is inherent in any design where heat is generated at one location and moved to a different location via ductwork or pipes.

In other systems, due to the long distance that air or other fluid is moved, a significant heat loss can occur, such that the fluid does not retain sufficient heat to heat the destination space. In such systems, an intermediate "booster" system can be incorporated to raise the temperature of the fluid before it is used to heat the destination space. Such booster systems are designed to raise the temperature of the fluid to a desired temperature, sufficient to allow heating of the destination space.

While resistance heating is known, it has not seen widespread adoption for use in heating structures such as buildings. Rather, it is relegated to specific applications. This includes the so-called portable space heaters that are used to heat a particular room or other space. In fact, such heaters are typically viewed as an inefficient way to heat rooms. Additionally, they are seen as carrying certain inherent risks of fire due to the high temperature heating elements typically used in such devices. Furthermore, such systems are not incorporated into the larger heating system of a building and operate completely independently of any other heating systems.

The resistive heating coatings and heating elements of the present disclosure have many potential applications, such as architectural coatings and heating, industrial coatings and heating, automotive seat warmers, heated clothing, ovens, kilns, and the like. In architectural applications, the coatings may be applied to walls, ceilings, floors, sidewalks or other exterior surfaces, and the like to provide heating for commercial and residential buildings. In industrial applications, the resistive heating coatings may be applied to aircraft for deicing, ice-prevention, shape controlling or other purposes, automotive vehicle panels, mirrors or other components for deicing or anti-fogging purposes. Thus, although the embodiments discussed herein primarily relate to applications in building or area heating, many other applications of the technologies and embodiments described herein exist.

Figure 10:
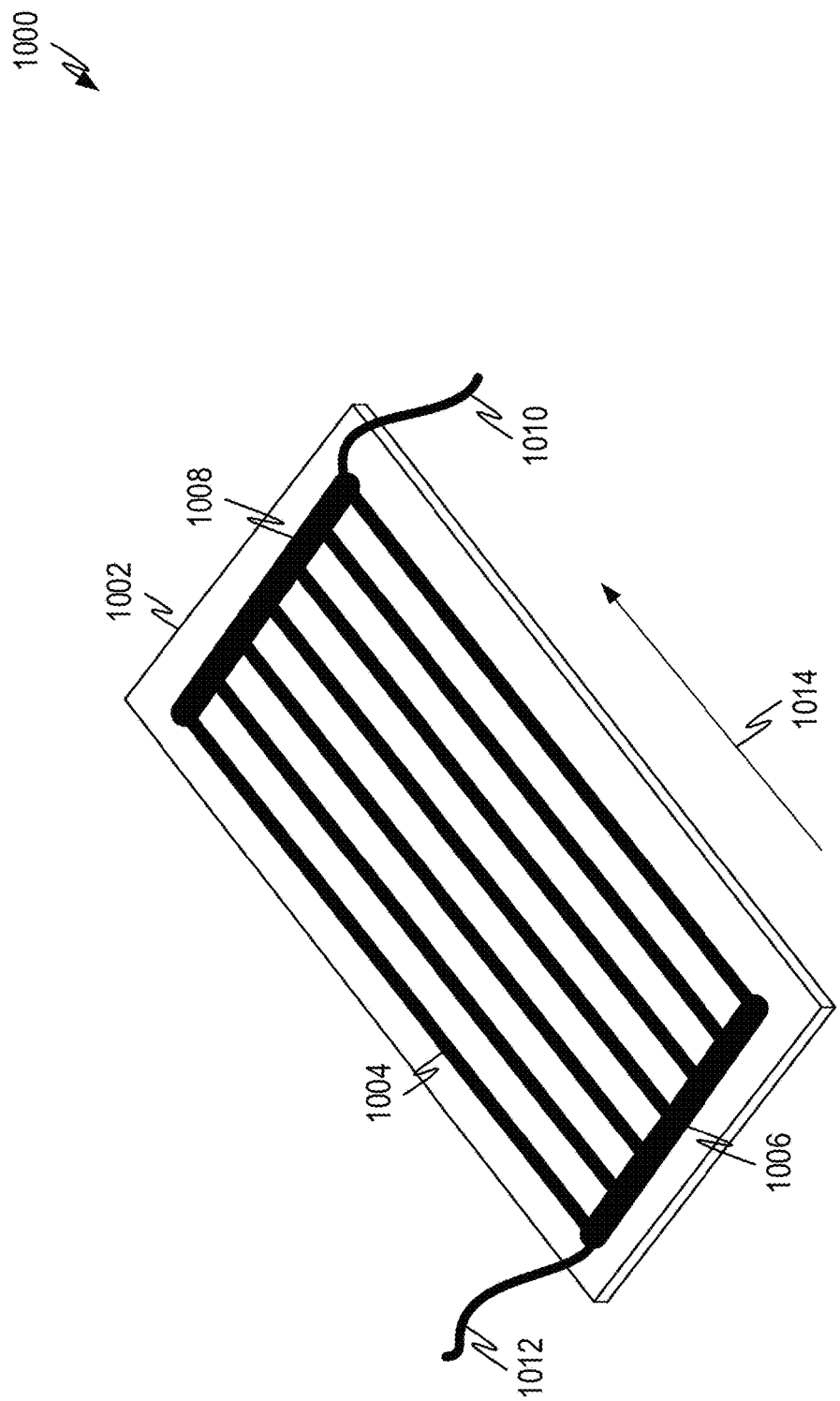
FIG. 10 illustrates another example of a solid-state heating element according to some aspects of the present disclosure.
Figure 11:
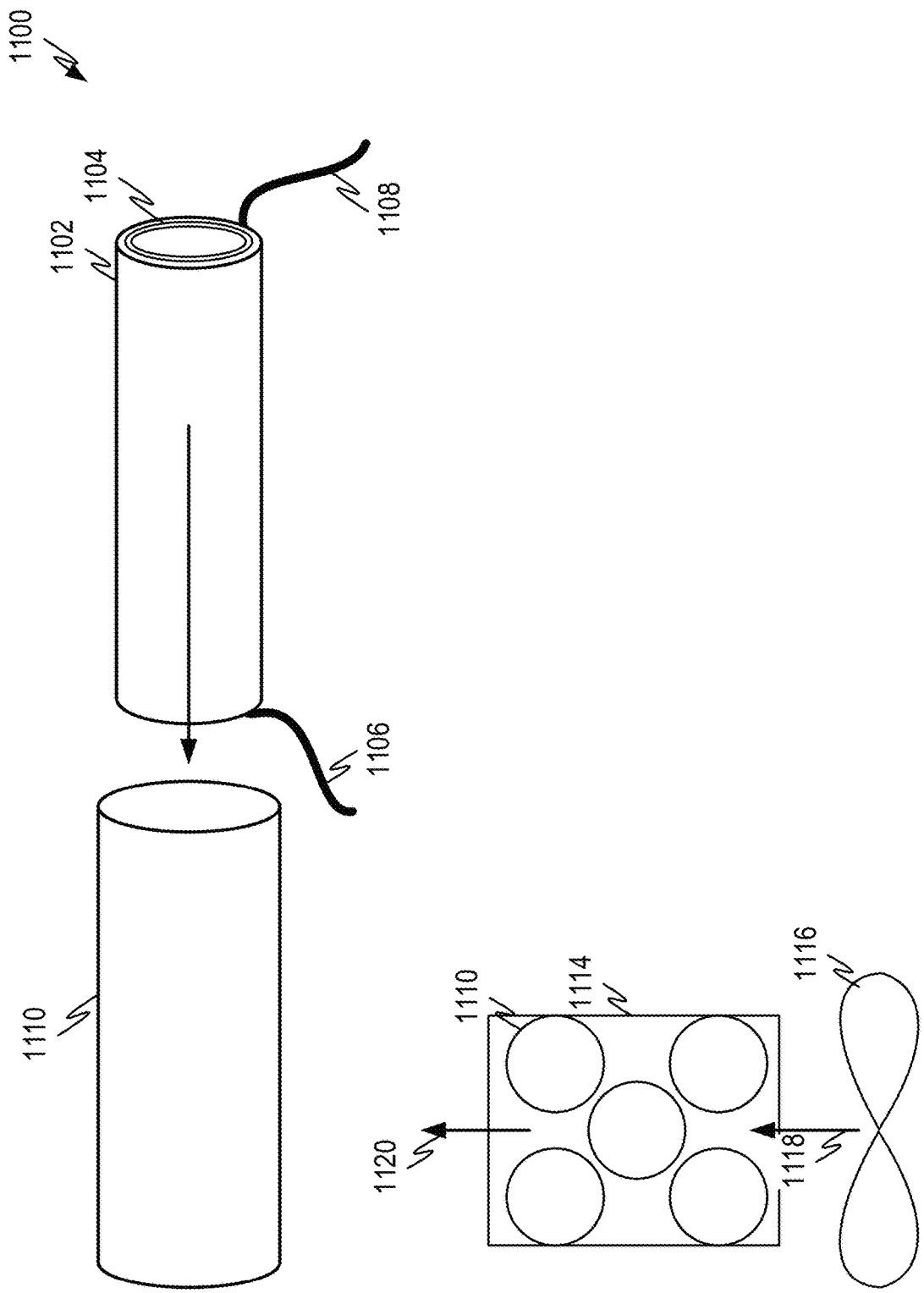
FIG. 11 illustrates another example of a solid-state heating element according to some aspects of the present disclosure.

As used herein, the term "electrically conductive", when referring to a coating containing carbon particles, means that the coating has an electrical conductivity sufficient to generate the desired heating effect. Put in terms of resistivity, rather than conductivity, a resistivity of a few ohms per square inch is generally sufficient to produce the desired heating effect. For example, in one test setup, a resistivity of between seven and eight ohms per square inch of carbon heating element was sufficient to generate a desired heating effect for a small space heater when the heating element consisted of heating element "strips" placed on a substrate such as illustrated in FIG. 10 and then rolled as illustrated in FIG. 11 to produce multiple heating layers as described herein. Other applications may have different resistivity requirements.

In accordance with certain embodiments, the coatings do not exhibit significant electrical conductivity absent the addition of carbon particles. For example, a cured or dried polymeric resin may have a conductivity that is not measurable, while cured or dried polymeric resins of the present disclosure including carbon particles may exhibit conductivities/resistances sufficient to achieve a desired target temperature as noted herein.

As used herein, the term "coating" means any type of film having a measurable thickness when applied to a substrate. The term "layer" means a measurable thickness of a material. In embodiments presented herein, a coating is used to create a layer, such as being disposed upon or infused within a substrate. In certain embodiments, the coating may include a film forming resin, may be a polymer, plastic or other similar material, may be free of a film-forming resin such as a metal coating, or may be provided in the form of an ink or other liquid. In other embodiments, the coating is not disposed upon a substrate, but rather is infused partially or wholly into the substrate.

As used herein, the term "resistive heating coating" and "heating layer" means a coating or layer, respectively, which generates heat by means of applying a voltage to the coating. This is also known as Joule heating or ohmic heating, where the electrical power dissipated in the coating is equal to $I^2R$ where I is the current flow in the coating due to the applied voltage, and R is electrical resistance of the coating. Such resistive heating coatings may be applied to various different types of rigid or flexible substrates such as metal, glass, plastic, ceramic, composite, fabric and the like. Voltage may be selectively applied to such coatings by any suitable means, such as by electrically conductive contacts, wires or printed strips located on opposite edges of the coating that create an electric potential causing current to flow through the coating from one electrical contact to the other, e.g., in the plane of the coating.

Embodiments of the present disclosure use solid state heating elements that heat to a maximum temperature. The heating elements of the present disclosure comprise a plurality of heating layers in close proximity to each other. The heating layers emit infrared radiation and the infrared radiation of the plurality of heating layers interact with each other to produce a temperature greater than the temperature the plurality of heating layers can produce individually. Surprisingly, as the number of layers increase, not only does the temperature of the overall element increase, but the power needed to produce the temperature goes down. For example, individually the heating layers may collectively consume W watts and produce a temperature, T. When placed in close proximity to each other, the heating layers may still consume W watts (or something close to W watts), however a much higher temperature T2 is reached. Thus, for a given temperature, less power is needed over prior art approaches.

The heating layer(s) are comprised of a mixture of carbon and a polymer or plastic. Specific examples are described below. The heating layer(s) are coated on, or infused in, a substrate. Examples of substrates are described below.

Some embodiments can comprise one or more heat sink/radiator elements, referred to more simply as a radiating element, to re-radiate heat produced by the element to a surrounding heat transfer fluid. In the context of this disclosure, fluid can comprise liquids or gasses used to transfer heat. The radiating element can be in close proximity to one or both of the heating layers.

The heating elements can be incorporated into forced air registers or booster systems as explained in further detail below. Heating systems can comprise any number of configurations, some of which are illustrated in the figures herein and/or described in the accompanying text.

These and other aspects are explained more fully below.

DESCRIPTION

FIG. 1 illustrates a solid-state heating element according to the prior art, illustrated generally as 100. The illustrated heating element has a single heating layer 102 and a substrate layer 104. The heating layer is typically a mixture of carbon and a polymer substance, although various additives are also known. The addition of carbon and/or other additives increases the conductance of the polymer so that a current can flow through the heating layer 102 when a voltage is applied, such as via a power supply 106. Such heating elements are typically used in lower temperature applications.

When a voltage is applied to the heating layer, such as via power supply 106, current flows through the heating layer 102 resulting in resistive heating. Resistive heating causes a thermal radiation and/or infrared emissions. Resistive heating is also known as Joule heating or ohmic heating, where the electrical power dissipated in the coating is equal to $I^2R$, where I is the current flow in the coating due to an applied voltage and R is the electrical resistance of the heating layer.

The substrate layer 104 can be rigid or flexible and in some instances can have an insulative quality, such as by having a lower conductance than the heating layer.

Figure 2:
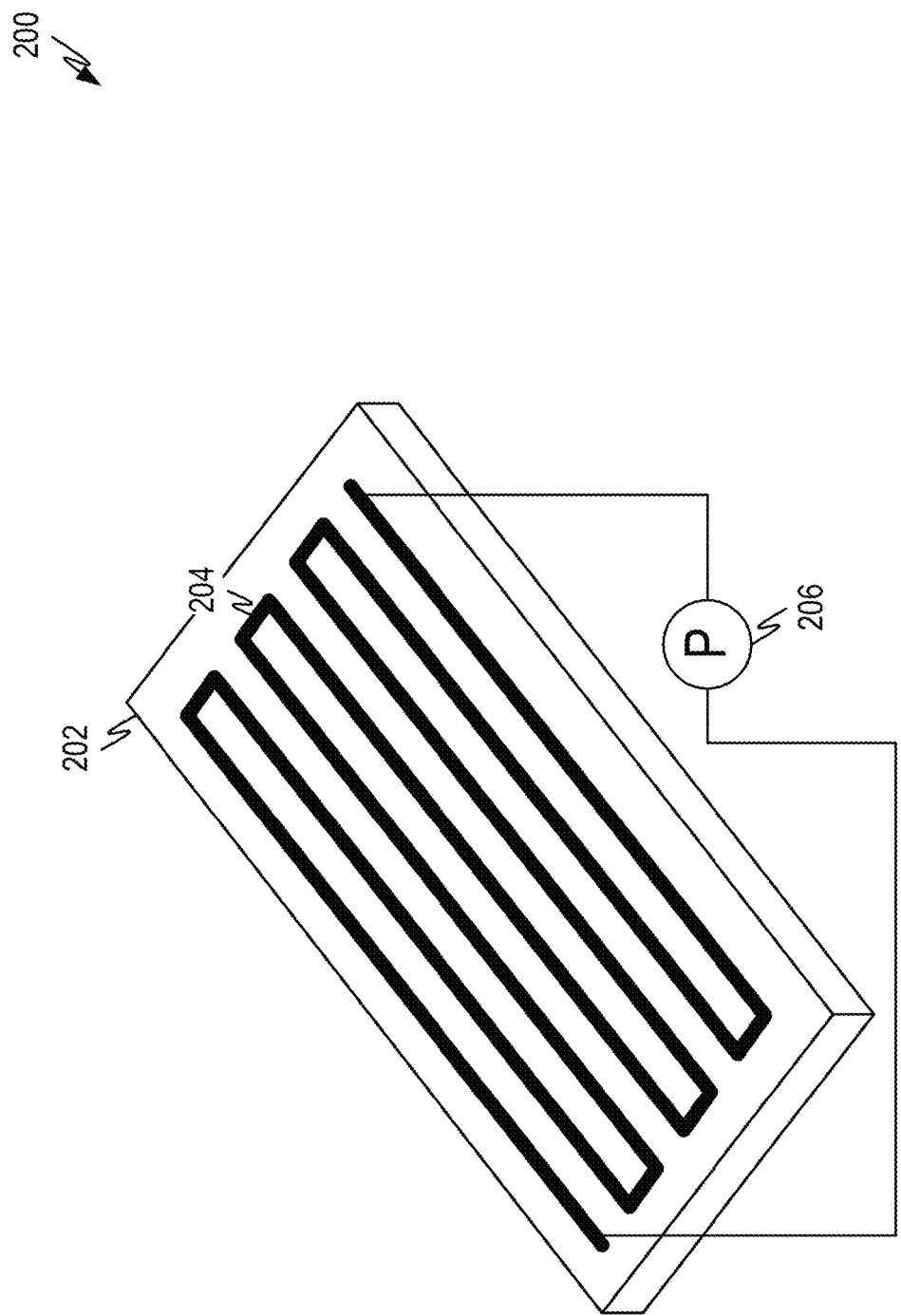
FIG. 2 illustrates another view of a solid-state heating element according to the prior art.

FIG. 2 illustrates another view of a solid-state heating element according to the prior art, shown generally as 200. In this embodiment, the heating layer 204 is placed on a substrate 202 in a way that provides a current path from one terminal to the other. In this embodiment, the heating layer 204 does not completely cover the substrate 202, but rather provides a path or trace that winds its way over the substrate.

Figure 3:
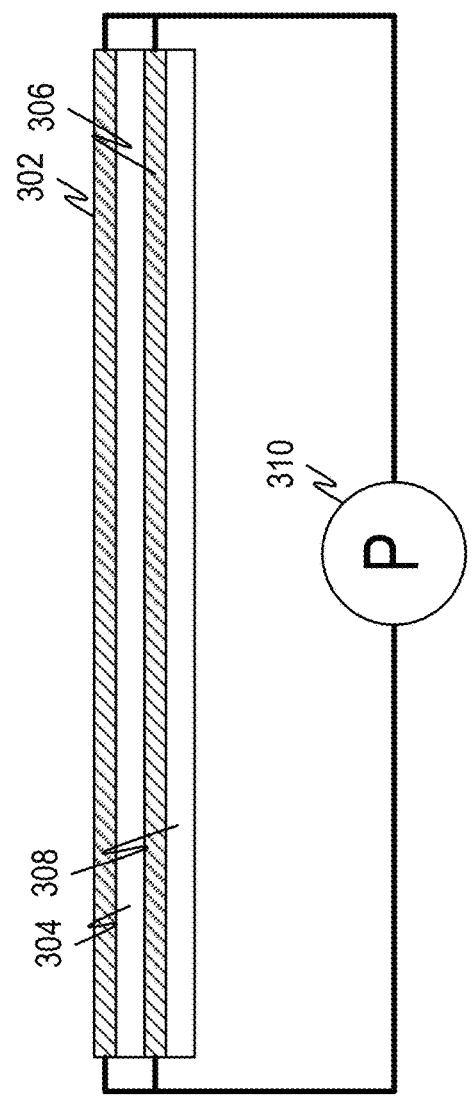
FIG. 3 illustrates an example of a solid-state heating element according to some aspects of the present disclosure.

FIG. 3 illustrates an example of a solid-state heating element according to some aspects of the present disclosure. This embodiment, shown generally as 300, comprises two heating layers 302 and 306, each having an associated substrate layer 304 and 308, respectively. The substrate layers 304 and 308 may have a lower conductivity than the heating layers 302 and 306 such that a voltage applied by power source 310 produces a current in the heating layers without substantial current flowing through the substrate layers 304 and 308.

Thus, embodiments according to some aspects of the present disclosure have a plurality of heating elements placed in close proximity to each other. In the embodiment of FIG. 3, the heating layers 302, 306 are separated by the thickness of the substrate 304. Experiments have shown that in general, the power saving effects of the present disclosure are observed when the heating layers 302, 306 are placed in close proximity to each other. Close proximity within the meaning of this application is less than about a half an inch.

The materials of the heating element are typically selected for their infrared emitting property, high heating efficiency, ease of manufacturing, consistent performance, flexibility, resistance to thermal breakdown beyond what can be withstood by the substrate, longevity (e.g., does not breakdown over time), and ability to withstand heat cycle degradation.

In some embodiments, the heating layers comprise a mixture of carbon and a polymer or plastic. The mixture is coated on, or infused in, a substrate. The carbon can comprise a graphene in some embodiments, with particles of such a size and shape that when the mixture is coated on, or infused in, the substrate, a desired level of conductivity is achieved. The graphene powder can be prepared by thermal exfoliation reduction. In one aspect, the graphene powder can be highly reduced which can deliver a conductivity greater than, or equal to, 8000 S/m. The graphene has been found to be superior to carbon black due to its lower percolation threshold value, although the latter can also be used. Additionally, the graphene can be easily dispersed for coating applications in a percentage of between 1% and 3% by weight in typical formulations.

The polymer or plastic can comprise virtually any polymer or plastic. Experiments have been performed on a wide variety of polymers and plastics and virtually any seem to work to a greater or lesser degree. For example, graphene was mixed with a latex compound, which was then mixed into a thinset mortar. The resultant combination of the latex compound with its graphene and thinset mortar produced a heating layer that could be incorporated into a floor heating element. Other examples that were tried include Dupont 5036, epoxies, polysiloxane, and so forth.

In one example DuPont® 5036, which is a non-conductive binder was used and for some types of substrates and heating layers can be a preferred way of modifying the resistance of a heating layer. By varying the ratios of carbon to polymer/plastic, a desired resistance per meter can be achieved at a designated coating thickness. Furthermore, the shape of the graphene/carbon particles can also influence the overall resistance, due to how the particles align in the graphene/carbon and polymer/plastic mixture. The overall resistance is, therefore, is a function of the mixture composition, the shape of the graphene/carbon particles, overall length of the heating layer, and width of the heating layer. Within certain bounds, the thickness of the heating layer does not affect the resistance as explained below.

In other formulations, the polymer can comprise a polysiloxane compound, which have outstanding temperature and oxidative stability. They are also very hydrophobic and have low moisture uptake. Their good electrical insulation characteristics and ability to withstand higher temperatures without degradation make polysiloxane a good polymer for many applications of the present embodiments.

Another approach is to use a carbon conductive ink, such as DuPont® 7102. It can be blended to achieve a wide range of resistance values with DuPont® 5025 silver, DuPont® 7082 high resistance carbon and DuPont® non-conductive binder in varying amounts to produce the desired resistance.

Conductivity/resistance can be increased or decreased by one of skill in the art by using different grades and/or quality of graphene and/or by altering the graphene content of the formulation.

A typical heating layer thickness is 0.002 in., although any thickness can be used. The thickness of the heating layer can be selected for even heat distribution, flexibility, ease of manufacturing, and cost. For thin heating layers such as thicknesses of several thousands of an inch, the thickness of the heating layer does not affect the resistivity of the material. However, the thickness of the heating layer does affect the flexibility of the sheet (heating layer plus substrate) as a whole.

In a representative example, a typical resistivity for the heating layer is 7.9 ohms/sq. in. This resistivity was sufficient to reach a desired target heat of about 80 degrees F.

The heating layers 302 and 306 can be disposed upon or infused into the substrate layers 304 and/or 308. A combination of deposition and infusion can be used in some embodiments to combine a heating layer with a substrate layer. In one representative example embodiment, a substrate was made of a harder under layer comprising PET (Polyethylene Terephthalate) plastic and a softer top layer of EVA (Ethylene-Vinay Acetate) plastic. This example was created to show a low design temperature of less than 100 degrees F., and 30 watts of power consumption.

In some embodiments of the present disclosure, the materials of the heating and/or substrate layer are selected for their ability to emit or pass infrared radiation.

The power source 310 can be an AC power source or DC power source. The voltage applied to the heating layers 302 and 306 causes a current to flow through the heating elements. In the illustrated embodiment, the heating layers are shown as being wired in parallel, although they can also be wired in series in some embodiments.

When the voltage is applied by power source 310, resistive heating causes a thermal radiation and/or infrared emissions from the heating layers 302 and 306. The temperature of the heating element will rise over time, approaching a temperature limit which the element will not exceed. This temperature limit is determined by various design parameters that include, but are not limited to, the composition of the heating layers, the number of heating layers, the length of the heating layers, the surface area of the heating layers, the thickness of the heating layers, the voltage applied by the power supply 310.

The composition of the heating layers (including the shape of the carbon/graphene particles), length of the heating layers, surface area of the heating layers, and thickness of the heating layers determine the inherent resistance of the heating layers as well as the thermal radiation and/or the spectrum of infrared heat that is produced. How the heating layers are wired (e.g., in series or parallel) determines the effective resistance seen by the power supply 310.

The substrate layers 304 and 308 can be rigid or flexible and can be comprised of virtually any material. In some embodiments, the substrate layer 304 and/or the substrate layer 308 are transparent or semi-transparent to the thermal and/or infrared radiation emitted by the heating layers 302, 306, such as those described above. This allows the interactions between the thermal and/or infrared radiation emitted by the heating layers 302, 306 to interact.

Embodiments of the present disclosure comprising multiple heating layers in close proximity to each other. As shown in other figures below, the heating layers, substrates, and so forth, can comprise various physical arrangements. However, all have multiple heating layers in close proximity to each other.

Surprisingly, as the number of heating layers increases, the thermal limit of the heating element increases, while the power needed to produce that temperature does not increase in proportion to the temperature. Stated a different way, a higher temperature is reached for a more efficient power expenditure. It is believed that the thermal and/or the infrared radiation produced by the individual heating layers interacts with each other to produce a temperature greater than either layer produces individually, while lowering the overall power requirements to reach that temperature.

In a first example, a rolled element was produced by rolling a single heating layer and placing the resultant element within a ceramic cup to measure the effect of varying the layers within the heating element. The center of the heating element was filled with marble to provide a sink for the produced infrared emissions and provide a place where the temperature could be measured.

With the single layer element (e.g., an element with a single layer), a steady state temperature of 72 deg. F. was reached and the element consumed 3.6 watts. This represented a 4 deg. F. temperature rise above the ambient temperature of 68 deg. F.

A second element was layered upon the first and both were rolled and placed within the same cup. In this configuration, the two elements rested upon each other with only a thin layer of vinyl separating the two elements. The result was a heating element similar to that of FIG. 3, where two heating layers were separated by a thin substrate. This element reached a steady state temperature of 120 deg. F. for the cup and a temperature of 107 deg. F. for the marble. The element consumed 6.9 watts. This represented a 52 deg. F. temperature rise above the ambient temperature of 68 deg. F. for the cup and a 39 deg. F. temperature rise above the ambient temperature of 68 deg. F. for the marble. Thus, the multiple elements resulted in greater than 10-fold increase in temperature rise (for the marble) for less than double the amount of additional power.

To show the effect of bringing the elements in close proximity to each other, the elements were separated and moved away from each other. The two separate single layer elements consumed approximately the same 6.9 Watts of power. However, the two elements only reached a peak steady state temperature of 72 deg. F.

There was some temperature variation across the face of the element itself in the multi-layer heating element example above. It is believed that the temperature variation on different parts of the element occurred because of small variations in the spacing between the layers due to the fact that the two elements were not mechanically connected to each other and only rested upon each other. Thus, some variation in spacing was inevitable.

Experiments have found that as the distance between the heating layers decreases, the temperature increases, without appreciably changing the total power consumption. Thus, higher temperatures are reached with increased efficiency.

In a second example, two separate elements were created by coating a high temperature glass substrate with a mixture of a polysiloxane resin and graphene in ratio of about 4 parts resin to 1 part graphene by weight, thereby forming a heating layer on top of a high temperature glass substrate. The high temperature glass substrates for the elements measured approximately 4 in by 2 in. A copper conductor was affixed to the heating layer on each end of each element so that a voltage applied across the conductors of an element would cause current to flow within the heating element. The elements were then cured by baking the elements at 450 deg. F. for 45 minutes. To further protect the heating layer, a layer of vinyl tape was added on top of the heating layer.

The two elements were placed side-by-side and connected to 120V AC power. The two elements together drew about 30 Watts of power. One reached a maximum temperature of 200 deg. F. and the other a maximum temperature of 175 deg. F. The ambient temperature was about 72 deg. F. and the time to reach the maximum temperature was estimated at 5 minutes.

The elements were allowed to cool and then the two elements were arranged so that one element resided on top of the other, with the two heating layers facing each other. In this arrangement, the two heating layers were in close proximity to each other with two layers of vinyl tape separating them. The high temperature substrate layers formed the "top" and "bottom" of the element.

When the same 120V AC power was applied, the following data was obtained. The beginning temperature was 72 deg. F. The power drawn by the elements was about 24.1 Watts, although this number varied somewhat across the duration of the test, with slightly higher values at the beginning of the test and slightly lower values toward the end of the test.

TABLE 1

Example 2, Time v. Temp

| Time | Temperature (deg. F.) |
| --- | --- |
| 30 sec. | 101 |
| 1 min. | 154 |
| 2 min. | 217 |
| 3 min. | 280 |
| 4 min. | 323 |
| 5 min. | 370 |
| 10 min. | 430 |
| 12 min. | 477 |

The test was terminated at the 12 min. mark due to concern that the vinyl tape would not withstand the continued heat. It is estimated that the final temperature would have exceeded 500 deg. F., had the test continued.

From this example, it can be seen that when the two heating layers were arranged in close proximity to each other, the maximum temperature reached was over twice that of the individual elements, while the power required to achieve that temperature was the same or slightly lower. This shows the unique and surprising results provided by embodiments of the present disclosure.

Figure 4:
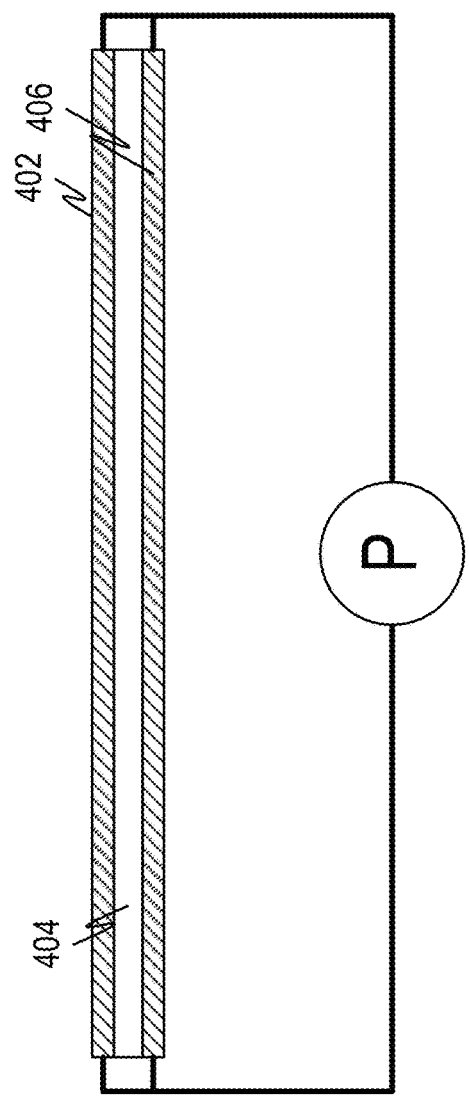
FIG. 4 illustrates another example of a solid-state heating element according to some aspects of the present disclosure.

FIG. 4 illustrates another example of a solid-state heating element according to some aspects of the present disclosure. The embodiment, shown generally as 400, comprises two heating layers 402 and 406 disposed upon, or infused within a common substrate 404. The heating layers 402 and 406 can comprise any of the mixtures as discussed in conjunction with FIG. 3. Similarly, the substrate 404 can have any of the properties discussed with respect to the substrates of FIG. 3.

By placing the heating layers 402, 406 on opposite sides of the substrate 404, one of the substrate layers discussed in conjunction with FIG. 3 can be eliminated, while providing multiple heating layers.

As discussed herein, the heating layers 402, 406 can be wired in parallel or series. Similarly, the power supply used to place a voltage across the heating layers 402, 406 can be AC or DC.

Although the heating and substrate layers in the embodiments of FIGS. 3 and 4 are depicted as residing in a single plane, the plane can be formed into any shape such as a corrugated shape, a loop shape, or any other shape. In some instances the shape can serve to further increase the number of layers, similar to the embodiments discussed in conjunction with FIG. 5.

Figure 5:
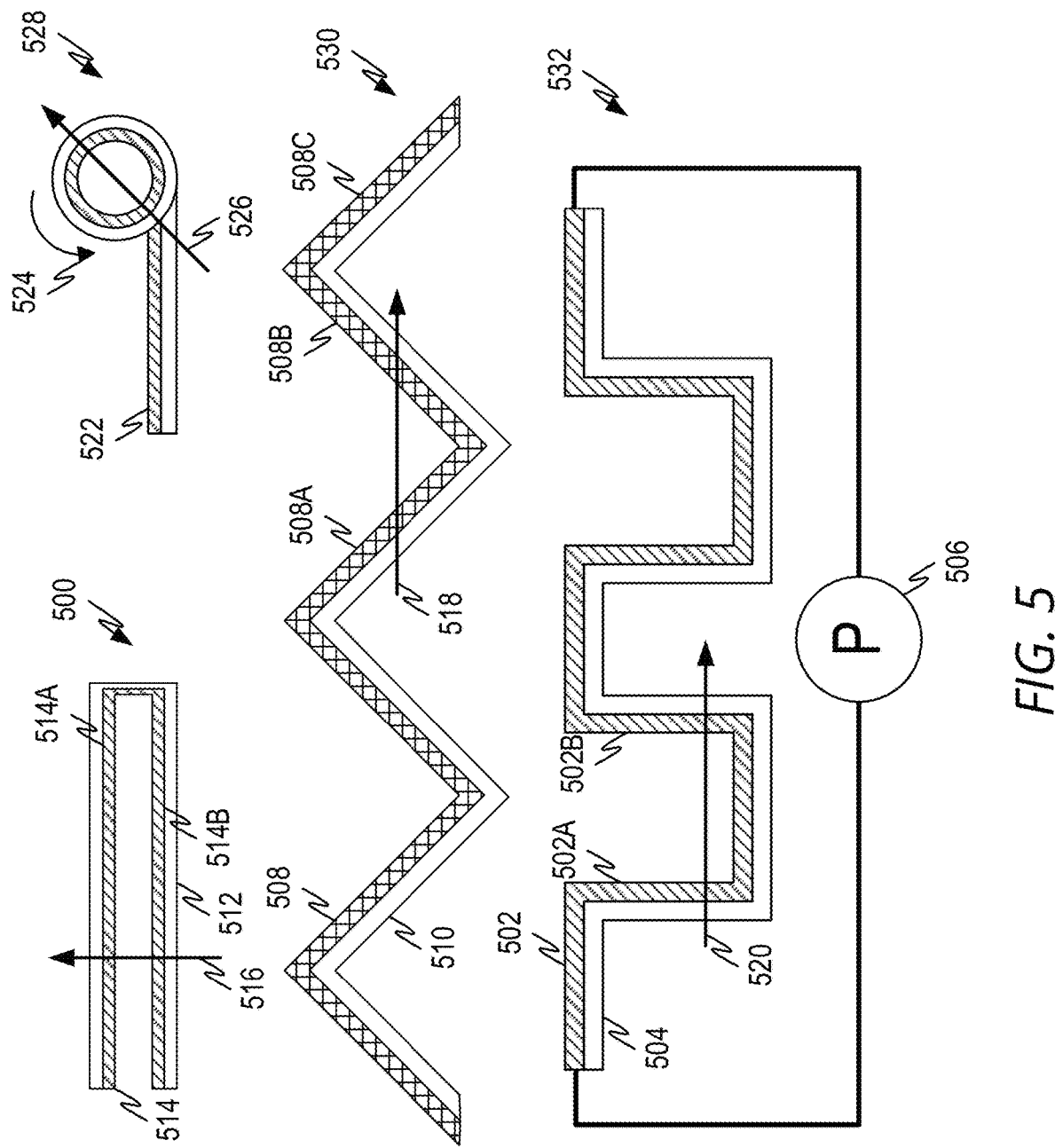
FIG. 5 illustrates another example of a solid-state heating elements according to some aspects of the present disclosure.

FIG. 5 illustrates several examples of a solid-state heating element according to some aspects of the present disclosure. This figure shows four separate representative embodiments, shown generally as 500, 528, 530, and 532, that allow multiple heating layers to be created from a single continuous heating layer by forming the heating layer into various geometric shapes.

In the top embodiment shown generally as 500, a single continuous heating layer 514 is disposed upon or infused into a single continuous substrate layer 512. The continuous heating layer 514 is then looped back upon itself as shown, thus creating a plurality of heating layers for a heating element. In the diagram, the heating layer 514 is looped back so it is facing itself. Alternatively, the heating layer 514 can be looped back so that the substrate 512 is facing itself.

In this embodiment, the existence of multiple layers is shown by the number of layers intersected by the directional arrow 516. In accordance with embodiments if the present disclosure, multiple layers exist when a directional arrow drawn at an angle to a substrate layer or heating layer, intersects multiple layers, or the same layer multiple times. As discussed above, multiple layers allow the infrared radiation from the one layer to interact with another layer. Thus, the radiation from the top portion of the heating layer 514a can interact with the radiation from the bottom portion of the heating layer 514b. The interaction provides the multiple layers.

In the embodiment that is shown, a space exists between the two layers 514a, 514b. Alternatively, the heating layer can be folded back on itself such that little or no space exists between the two layers 514a, 514b. The same is true should the single continuous layer 514 be folded back on itself so that the substrate 512 was facing itself.

A voltage can be placed across the layer by attaching a power supply to the ends of the continuous heating layer 514.

In the other top embodiment shown generally as 528, a single heating layer 522 is disposed upon a single substrate. The heating layer/substrate structure is then rolled upon itself as shown by arrow 524 to create a coil of multiple layers, as shown by arrow 526. The central region can be hollow or can be filled with a heat sink or other structure as disclosed herein.

Power can be applied to the coiled heating element by attaching a power supply to each end of the heating layer/substrate structure. This will result in one lead coming from the inner most layer of the coil and one lead from the outer most layer of the coil.

In the middle embodiment, shown generally as 530, a single continuous heating layer 508 is disposed upon or infused into a single continuous substrate layer 510. The element is then formed into a corrugated shape, such that one portion of the heating layer 508a faces another portion of the heating layer 508b. As illustrated, the heating layers 508a, 508b can face each other at an angle. Thus, a directional arrow 518 drawn through the geometric shape intersects the heating layers 508a, 508b.

The corrugated shape means that segments of the continuous heating layer 508 present both faces to another segment of the heating layer. Thus, heating layer 508a can interact with heating layer 508b. Similarly, the heating layer 508b can interact with 508c. Although the corrugations are shown as having space between them, the corrugations can be "collapsed" so that layers rest upon, or are in close proximity to, each other.

A voltage can be placed across the layer by attaching a power supply to the ends of the continuous heating layer 508.

In the bottom embodiment shown generally as 532, a single continuous heating layer 502 is disposed upon or infused into a single continuous substrate layer 504. The element is then formed into a different corrugated shape that forms multiple "U" shapes with portions of the heating layer 502a, 502b facing each other. Again, a directional arrow 520 drawn through the geometric shape intersects the heating layers 502a, 502b.

This embodiment shows that there can be portions of the continuous heating element 502 that do not face another portion of the continuous heating element when the geometric shape is formed and yet have other portions of the continuous heating element 502 form multiple layers. Additionally, although the portions of the element 502a, 502b that face each other are shown with a gap between them, the gap can be minimized or eliminated by placing the portions of the element 502a, 502b next to each other with little or no space between them.

A voltage is applied across the heating element 502 by attaching a power supply 506 to the ends of the heating element 502.

Although the embodiments of FIG. 5 show how a single heating layer can be used to form heating elements that have multiple heating layers by forming the single heating layer into various geometric shapes, other embodiments can form heating elements by forming multiple heating layers into geometric shapes. Thus, multiple heating layer structures such as those shown in FIG. 3 or FIG. 4, can be formed into geometric shapes such as those shown in FIG. 5 to create heating elements with more than two layers.

Figure 6:
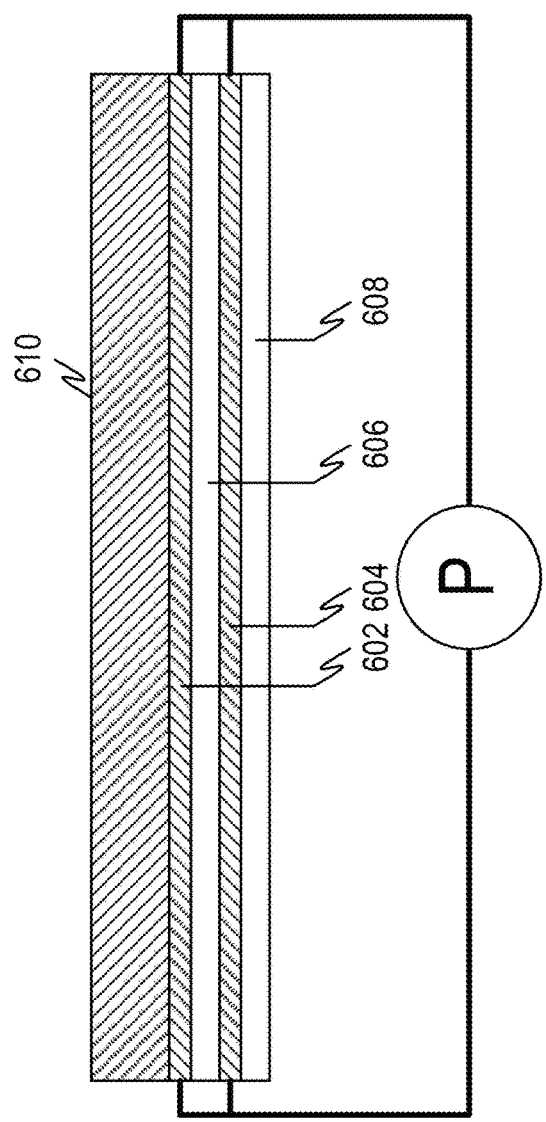
FIG. 6 illustrates another example of a solid-state heating element according to some aspects of the present disclosure.

FIG. 6 illustrates another example of a solid-state heating element according to some aspects of the present disclosure. This embodiment, shown generally as 600, comprises a plurality of heating layers 602, 604, disposed upon or infused within a respective substrate 606, 608. Additionally, a radiating element 610 is attached to or disposed in proximity to the heating element. The heating layers and substrate layer can be as previously described in any of the multi-layer embodiments above.

A radiating element 610 can comprise any material that absorbs the radiation/heat emitted by the heating element and reradiates heat. As discussed, the carbon heating layers of the multilayer heating elements disclosed herein radiate in the infrared spectrum. Thus, the radiating element 610 can be formed of a material that absorbs the infrared radiation and heat produced by the heating layers and reradiates the absorbed radiation and/or heat as heat. To increase efficiency, the radiating element 610 can be selected to absorb infrared radiation in the spectrum emitted by the heating element and/or transfer heat from the heating layers to a fluid such as air or water. Thus, the absorption characteristics of the material of the radiating element 610 can be matched to the radiation spectrum of the heating element.

In some representative embodiments, the radiating element 610 can comprise a metal foam material such as copper foam. In other representative embodiments, the radiating element 610 can comprise a polymer foam. In still other representative embodiments, the radiating element 610 can comprise a dense material that absorbs infrared radiation well, yet can hold heat, such as stone, ceramic, concrete, or other such material. In still further embodiments, the radiating element 610 can comprise a material that efficiently transfers heat away from the heating layers such as aluminum to a working fluid such as air.

The radiating element 610 can be attached to the heating element with an adhesive suitable for the materials of the radiating element 610 and the heating layer 602 and/or an insulating layer between the radiating element 610 and the heating layer 602. Additionally, or alternatively, mechanical fastening means can also be used to keep the heating layer 602 in close contact with the radiating element 610. Such fastening means can be any mechanism that attaches the radiating element 610 and the heating layer 602. Additionally, or alternatively, the radiating element 610 can be modified such that the heating element resides within the radiating element 610. For example, a channel can be cut into the radiating element 610 and the heating element (e.g., layers 602, 604, 606, 608) can be inserted into the channel and held in place by pressure from the sides of the channel and/or a suitable adhesive. In yet another example, the radiating element can be disposed in proximity to the heating element with no mechanical or adhesive fastening mechanism.

In embodiments where the heating element is incorporated into a heating unit, such as those described below, where a fluid is used to transfer heat from the heating element to the ambient air, the radiating element 610 can help stabilize the rate of heat transfer. Thus, the material can be selected to match the desired heat transfer characteristics.

Although the embodiment depicted in FIG. 6 illustrates two heat layers and two substrate layers, any number of heating layers and/or substrate layers may be utilized. Similarly, although only one radiating element 610 is illustrated, an additional radiating element can also be placed on the other side of the heating element and/or an additional heating element can be placed on the other side of the radiating element 610.

Figure 7:
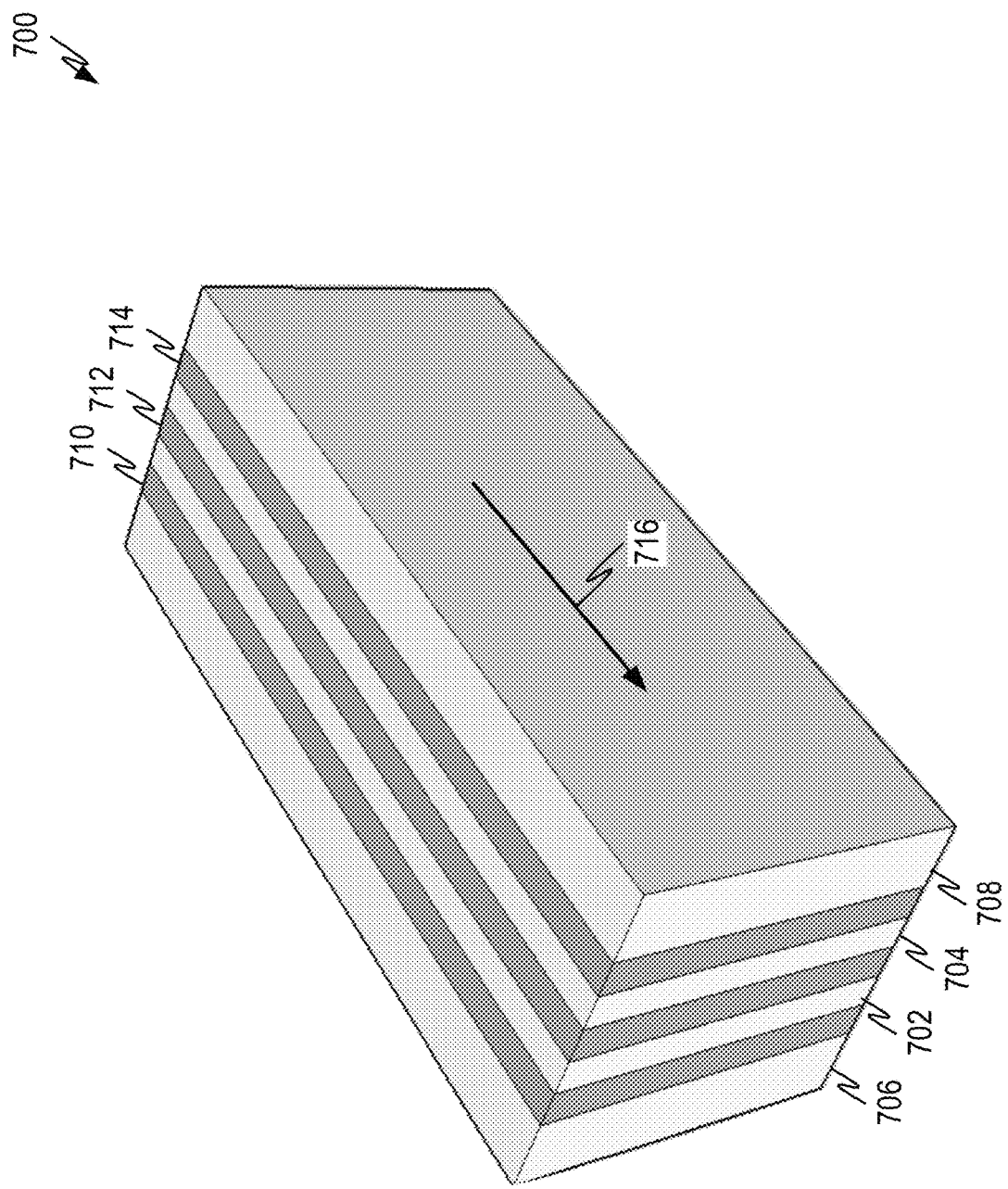
FIG. 7 illustrates another example of a solid-state heating element according to some aspects of the present disclosure.

FIG. 7 illustrates another example of a solid-state heating element according to some aspects of the present disclosure. The embodiment of FIG. 7, shown generally as 700, shows a three-dimensional representation of a sample heating element. The three-dimensional representation illustrates that heating elements, shown in cross section in the embodiments in FIGS. 3-7, have length, width, and depth dimensions.

In the embodiment of FIG. 7, two radiating elements 706, 708 are arranged on the element so as to radiate heat. Next to each radiating element is an optional insulation and/or connection layer 710, 714 that represents a mechanism to keep radiating element 706, 708 connected to and/or in proximity to heating layers 702, 704. The heating element also comprises two heating layers 702, 704, disposed upon or infused within a substrate 712.

Current flows through the heating layers 702, 704 in the length dimension, which is indicated by the directional arrow 716.

The insulating/connection layers 710, 714 can comprise the same material or a different material than the substrate layer 712. In many instances, such a layer comprises only a very thin coating. For example, the insulating/connection layers 710, 714 can be provided by a coating on the radiating elements 706, 708.

Additionally, or alternatively, layers 710, 714 can be a substrate for the heating layers 702, 704, respectively with layer 712 arranged to keep the heating layers 702, 704 in close proximity to each other. In some embodiments, such a layer only need provide sufficient separation between the heating layers to achieve the desired spacing between the heating layers, so that they are in close proximity to each other.

Although multiple radiating elements 706, 708 are shown, only one element is used in some embodiments. In such an embodiment, the corresponding insulation/connection layer and/or substrate layer may be removed. Thus, in some embodiments, if radiating element 708 is removed, the insulating/connection layer 714 can also be removed.

Figure 8:
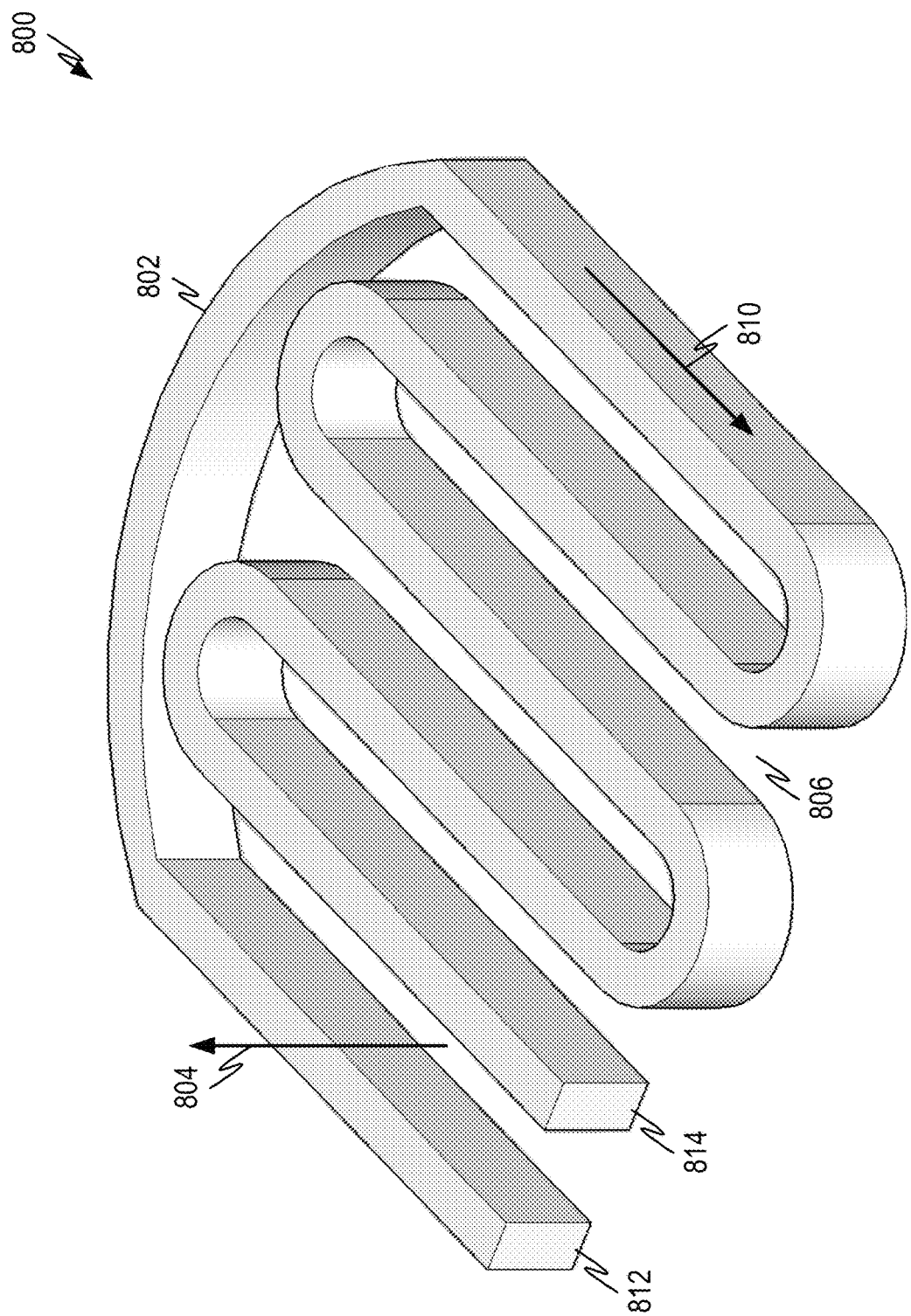
FIG. 8 illustrates another example of a solid-state heating element according to some aspects of the present disclosure.

FIG. 8 illustrates another example of a solid-state heating element according to some aspects of the present disclosure. The heating element, shown generally as 800, illustrates how heating elements presented in FIGS. 3-7 can be manufactured in geometric shapes for various embodiments. The heating element 802 can comprise a structure such as presented in any of the embodiments of FIGS. 3-7.

A power supply can be attached to the heating layers at ends 812, 814, to produce a current in the heating layers as indicated by arrow 810.

The heating element 802 can be formed into a geometric shape that has passages 806 between the various sections of the heating element 802. Air or another fluid can be passed through the passages as indicated by arrow 804 in order to cause heat transfer from the heating element 802 to the fluid. The fluid can then be used to transfer the heat to another location, to a room/space, and so forth as described herein. Although any heating element illustrated can be utilized, when the fluid passed over the heating element 802 does not readily absorb infrared radiation, experiments have shown that embodiments that have a radiating element (such as radiating element 610, or 706, or 708) result in heat transfer that is more efficient and the heating element is able to provide a more stable overall temperature. Such an observation may not be true for fluid that readily absorbs infrared radiation. In accordance with this disclosure any of the embodiments in FIGS. 3-7 can be modified to include one or more radiating elements if desired.

Because the heating layers can be disposed on or infused in flexible substrates, the flexible substrates can form a wide variety of geometric shapes. The shape illustrated in FIG. 8 provides a benefit that the channels 806 can be sized such that heat transfer from the heating element is efficient. In some embodiments the channels 806 are sized such that the fluid passing over the heating element 802 through the channels flows freely and does not provide substantial resistance (e.g., back pressure) to fluid flow. Additionally, in some applications, having the two ends 812, 814 in proximity to each other can make attaching a power supply to the heating element 802 easier.

Figure 9:
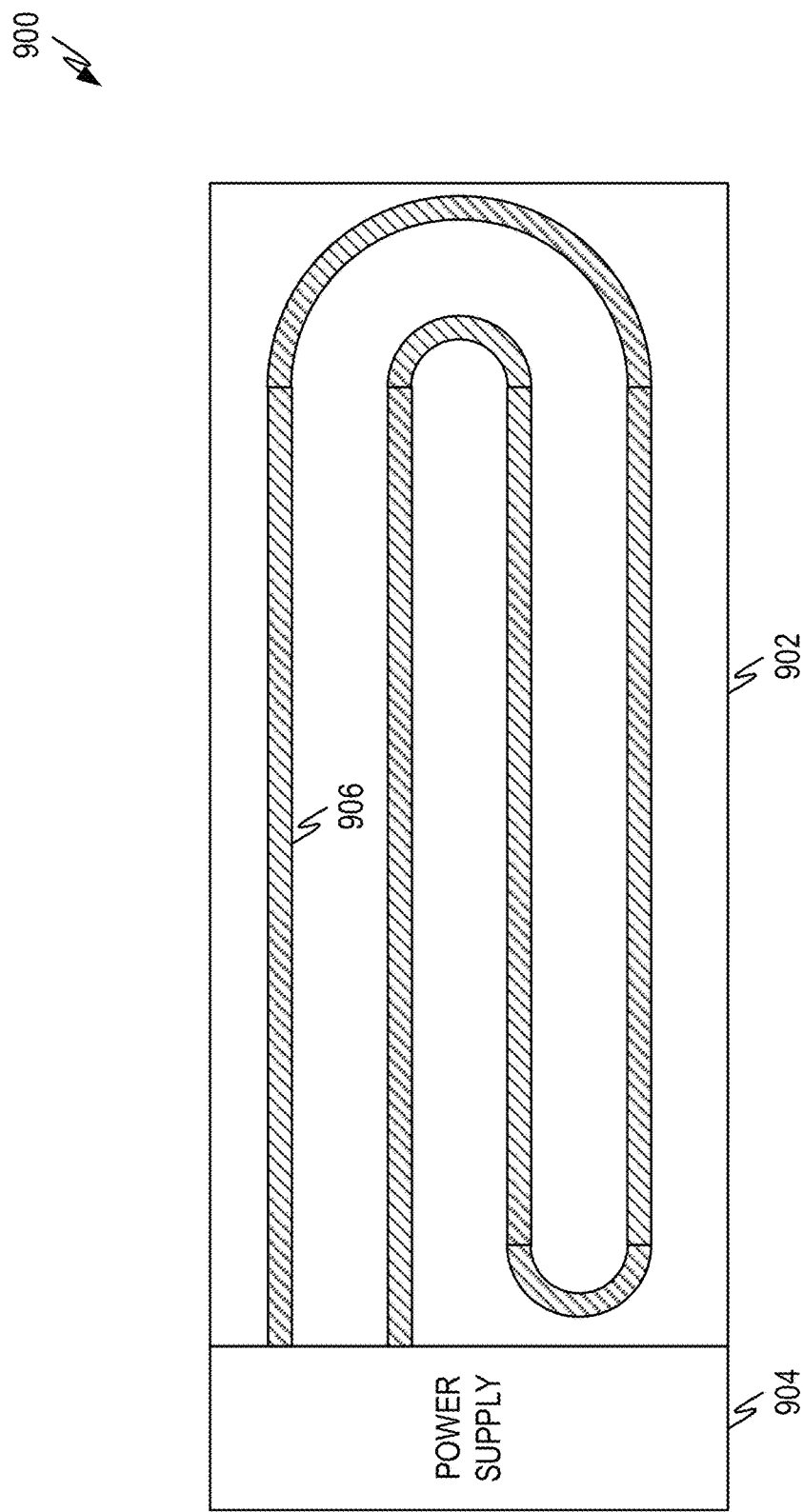
FIG. 9 illustrates an example of an in-vent heating system incorporating a solid-state heating element according to some aspects of the present disclosure.

FIG. 9 illustrates an example of an in-vent heating system incorporating a solid-state heating element according to some aspects of the present disclosure. This embodiment is created to be disposed within a vent or duct of a heating system as discussed in greater detail below. The embodiment, shown generally as 900, is shown from a top-view cross section. The embodiment comprises a housing 902 that includes a power supply 904 at one end. The overall dimensions of the housing 902 including power supply 904 is sized to fit within the vent or ductwork of a forced air system, for example. Thus, the overall dimensions can be the same as, or a similar to, heating registers that fit within the ductwork or vent. Although a rectangular housing shape is shown for housing 902, the shape can be circular/cylindrical or any other shape that readily fits within the desired ductwork and/or vent(s) of the heating system.

Within the housing a heating element 906 resides. The geometric shape of the heating element 906 can comprise any geometric shape that provides sufficient passage for the air to flow over the heating element to allow for the desired heat transfer. In the illustration, the shape is similar to that shown in FIG. 8, although any shape can be used.

The heating element 906 comprises a plurality of heating layers such as those shown in any of the FIGS. 3-8. Although two heating layers are shown in the heating elements of FIGS. 3-8, any number of layers over two can also be used in some embodiments. The materials are specified to produce a particular maximum temperature as discussed above.

In some embodiments, a radiating element is placed in close proximity to one or more of the heating layers so that the radiating element causes heat transfer to the air that is passed over the heating element 906.

The power supply 904 is attached to the heating element 906 and causes a current to flow within the heating element 906. The power supply 904 can be an AC power supply, a DC power supply, or a combination power supply that utilizes AC when AC power is available and DC power when AC power is not available.

When the power supply 904 comprises AC power, the AC power supply can place standard line voltage across the heating element 906. The standard line voltage can vary somewhat from country to country as is well known. In one representative example, the standard line voltage is 120V AC.

In embodiments where the power supply 904 is a DC only power source (e.g., one or more batteries), a charging port can be provided, such as a Universal Serial Bus (USB) charging port or another suitable charging port in order to recharge batteries in the power supply that provide power. In embodiments where the power supply 904 comprises both an AC power source and a DC power source, the power supply can be configured so that the AC power source charges the DC power source to keep the DC power source topped off when AC power is available. Such designs are well known and need not be further discussed.

FIG. 10 illustrates another embodiment of a multi-layer heating element. The element starts with a single substrate 1002 upon which multiple heating element strips 1004 are disposed. The substrate 1002 can comprise any flexible substrate materials sufficient to withstand the heat produced by the element. Substrate materials embodiments herein are selected for strength and heat cycle tolerance and, in some cases, ease of manufacture. For heating elements such as described in this embodiment, substrate material is also selected for flexibility. In one representative embodiment, the substrate 1002 can comprise a polycarbonate material such as those previously described. In one embodiment, the substrate 1002 is 12 inches wide and 4 feet long. The heating strips are 0.0002 thick, 10 inches long, 0.375 inches wide, and are spaced 0.216 inches apart.

The multiple heating element strips 1004 are a mixture of carbon and a polymer or plastic as described herein. As power flows through each of the heating element strips 1004, heat will be generated.

The heating element strips 1004 are connected to two power supply strips 1006, 1008, which are typically selected for flexibility, high conductivity, thermal resistance, and heat capacity. For example, the power supply strips 1006, 1008 can comprise copper conductors electrically bonded to the heating element strips 1004. Power can be supplied to the copper strips through conductors such as wires 1010, 1012. In one embodiment, the power supply strips 1006, 1008 are 0.005 inches thick, and 0.5 inches wide.

One or multiple radiating elements (not shown) can be placed on the heating element strips 1004. For example, a polymer or metal foam can be bonded to the substrate 1002 so as to reside on or in close proximity to the heating element strips 1004. The radiating element can be sized in thickness to provide a desired spacing between heating element strips 1004 when the substrate is formed into a geometric shape, such as those described herein. For example, in one embodiment, the radiating element is made of a polymer foam having a peak absorption at the infrared wavelength produced by the heating element strips 1004. The thickness of the radiating element in this embodiment is between 0.1 in. and 0.4 in. Three radiating element strips 0.5 in wide were placed lengthwise at the top of the substrate, the middle of the substrate and the bottom of the substrate. Additionally, a block of radiating element material 3 inches wide is placed along one edge of the substrate indicated by the number 1002.

Starting with the edge without the radiating element, the substrate of the embodiment is tightly coiled in the direction illustrated by arrow 1014 to form a coil having multiple heating layers with strips of radiating element between in order to space the layers at the desired distance apart. Air can then be passed between the various layers of the coil to heat the air. The polymer foam allows passage of the air while it also evens out the heat transfer.

FIG. 11 shows an alternate embodiment, shown generally as 1100, that utilizes a coil element. In this embodiment, a single layer heating element such as that described in FIG. 10, is coiled as previously described. This results in coil element 1102 which has multiple heating layers 1104. Electrical conductors to connect the coil element 1102 to a power supply can be attached either at the same end or at different ends as shown by the conductors 1106 and 1108.

The coil element 1102 can be placed inside a heat sink structure 1110 as shown by the arrow. In some embodiments the heat sink structure 1110 is a hollow tube comprising a ceramic or other material that can absorb heat and infrared radiation produced by the coil element 1102 and then reradiate the absorbed heat and infrared radiation as heat.

One or more of the heat sink 1110 and coil element 1102 structures can be disposed within a housing 1114 as illustrated. Heat dissipation fins can be disposed between heat sink 1110/coil element 1102 structures in order to spread the heat out faster and allow the heat transfer fluid 1118 to more quickly absorb heat as it passes over the heat elements.

A fan 1116 can be used to move air or another transfer fluid so that the outlet air 1120 temperature is higher than the inlet air 1118 temperature due to the absorbed heat.

FIG. 12 illustrates two examples of an in-duct heating system incorporating a solid-state heating element according to some aspects of the present disclosure. An embodiment disposed within a square duct is shown generally as 1200 and an embodiment disposed within a round duct is shown generally as 1202. Both embodiments are shown in cross-section with respect to a cross-section of the duct.

Turning first to the embodiment shown generally as 1200, a heating element comprising a plurality of heating layers is shown as having two heating layers 1204, 1208 disposed upon or infused into a respective substrate 1206, 1210. The heating layers 1204, 1208 reside in close proximity to each other so that the infrared radiation produced by one layer can interact with the other layer. Attached to the substrate layers are a plurality of radiating fins 1212, 1214 that move the heat created by the element away from the element so that a working fluid, such as air, that is blown across the radiating fins 1212, 1214 can be raised in temperature. The duct is illustrated by 1216.

The embodiment shown generally as 1202 comprises a plurality of heating layers 1218, 1222 each disposed upon, or infused within, a respective substrate 1216, 1220. The heating layers 1218, 1222 reside in close proximity to each other so that the infrared radiation produced by one layer can interact with the other layer. Attached to the outermost substrate layer are a plurality of radiating fins 1224 which move the heat created by the element away from the element so that a working fluid, such as air, that is blown across the radiating fins 1224 can be raised in temperature. The duct is illustrated by 1226.

Although the central heating element of the embodiment shown generally as 1202 is depicted as circular/cylindrical, a rectangular element can also be used. For example, an aluminum "U" channel can contain a plurality of heating and insulating layers. As one example, an heating layer of a polysiloxane/graphene mixture can be placed inside the "U" channel. An insulating layer of polysiloxane can be placed on top of the heating layer in the "U" channel, and so forth, alternating heating and insulating layers until a plurality of heating layers are placed in the "U" channel. The "U" channel can then be sealed so that the heating/insulating layers reside on the inside of the channel. Radiating fins such as 1224 can then be attached to the sealed "U" channel and disposed inside of a duct as shown.

As illustrated by these two embodiments, the term "close proximity" can include touching as well as some space between the elements.

These in-duct embodiments may be suitable for a booster system in a commercial HVAC system.

Figure 13:
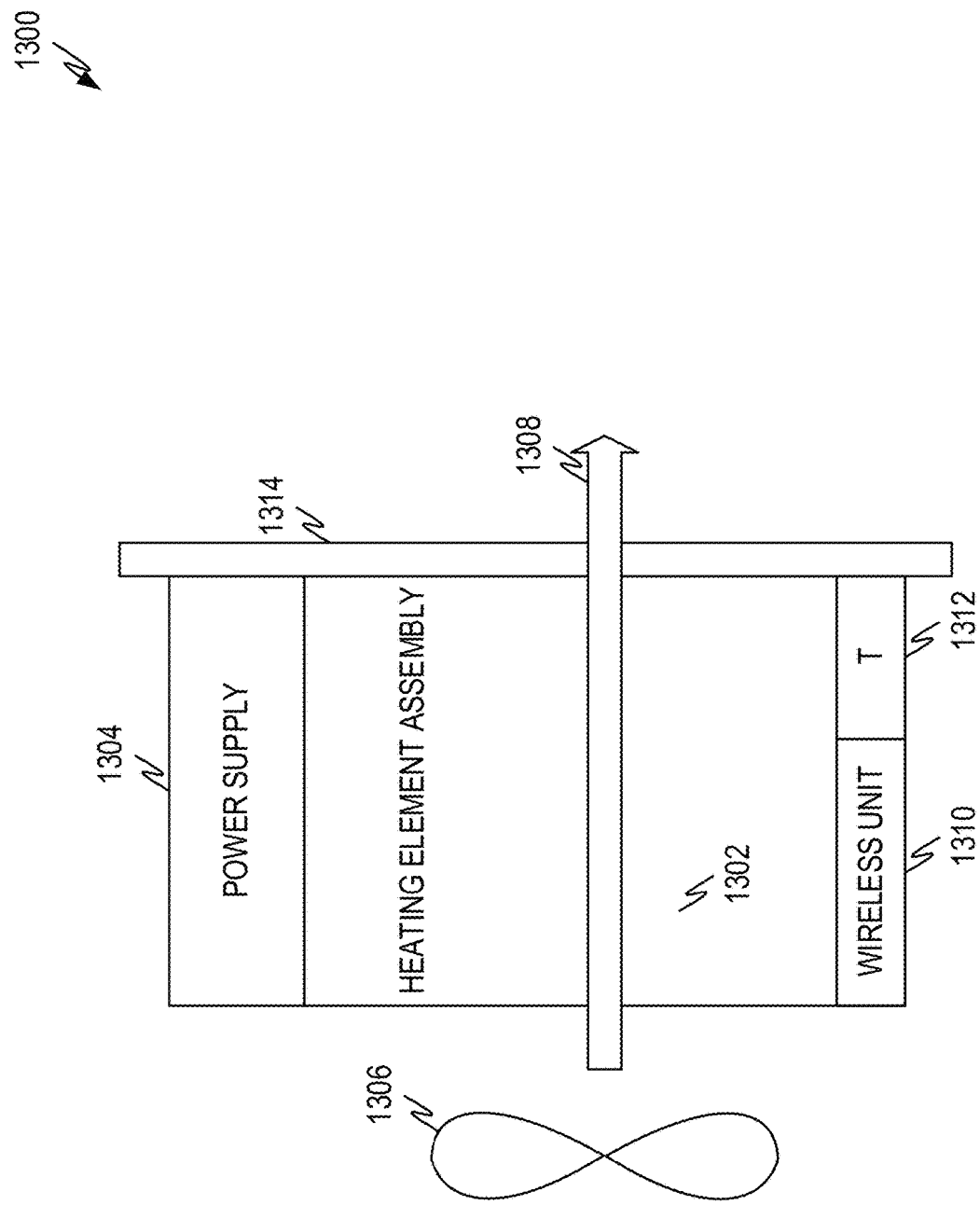
FIG. 13 illustrates another example of an in-vent heating system incorporating a solid-state heating element according to some aspects of the present disclosure.

FIG. 13 illustrates an example of an in-vent or in-duct heating system incorporating a solid-state heating element according to some aspects of the present disclosure. The embodiment, shown generally as 1300, can be a side view of an embodiment similar to that shown in FIG. 9-FIG. 12, although any of the solid-state heating elements described herein can be used.

The embodiment comprises a housing 1314 sized to fit within the ductwork of a forced air heating system as discussed above. The embodiment also comprises a heating element assembly 1302 which comprises a geometrically shaped, multi-layer heating element such as any of the heating elements described herein.

A fan 1306 causes air to pass over the heating element in the assembly 1302, and exit the system as illustrated by arrow 1308. The fan 1306 can be part of the in-vent or in-duct heating system, or can be part of the forced air system. Additionally, or alternatively, the fan 1306 can be part of the in-vent or in-duct heating system and a separate fan can be part of the forced air system. In embodiments where the fan 1306 is part of the in-vent/in-duct heating system, the fan can draw power from the power supply 1304 for its operation.

Power supply 1304 causes a current to flow within the heating element. The power supply can be an AC power supply, a DC power supply, or a combination thereof.

The in-vent heating system of FIG. 13 can further comprise additional aspects, such as a wireless unit 1310, a thermostat 1312 and/or other sensors, and/or a display (not shown), in any combination. The wireless unit 1310 can comprise a Bluetooth module, a WiFi module, and/or other such wireless units. In some embodiments, the wireless unit communicates with an automation hub to allow a user, control system, or other component to control the in-vent heating system through a computer, mobile device, or other similar devices, to integrate the in-vent heating system into a larger system such as those described below, and/or for other reasons such as data collection, diagnostics, and so forth. In other embodiments, the wireless unit communicates directly with remote sensors, a control system, the forced air system, and/or other devices to provide an overall system that integrates the in-vent heating system into a larger system, such as those described below.

The thermostat 1312 can control operation of the device such that when the temperature in the room or other space reaches the designated temperature, the in-vent system shuts off. Such a shut off can be of the heating element assembly 1202, the fan 1206, or both. Additionally, or alternatively, the same or a different thermostat can monitor the temperature of the heating element, and/or the air, so that the heating element and/or air does not exceed a set temperature.

Additional features that are incorporated into embodiments, either by themselves or in combination with one or more of the features described above can include a display for displaying information such as the current temperature of the room, the set temperature of the thermostat, the temperature of the heating element, operating status, and/or other information.

Additionally, or alternatively, embodiments can comprise one or more additional sensors. For example, an airflow sensor can be incorporated into the in-vent heat system. When the forced air system begins to operate and air begins to flow through the register, the temperature of the incoming air can be measured. When the temperature is below a designated temperature, the heating element can be turned on to heat the air to a desired temperature. This mitigates cold air blowing into the room until the air from the furnace reaches the designated temperature at the register. Once the incoming air reaches the designated temperature, the heating element can be turned off. Such an embodiment is described in greater detail below.

Furthermore, if an embodiment of FIG. 13 has a fan 1306 within the in-vent/in-duct system and a power supply 1304 that includes a DC power source, heat can still be delivered to the room even in the event of a power outage.

Although the embodiment of FIG. 13 has been described in the context of an in-vent/in-duct system, the various aspects described herein can be incorporated into a stand-alone system that is housed within a housing that is separate from ductwork of a forced air system.

Figure 14:
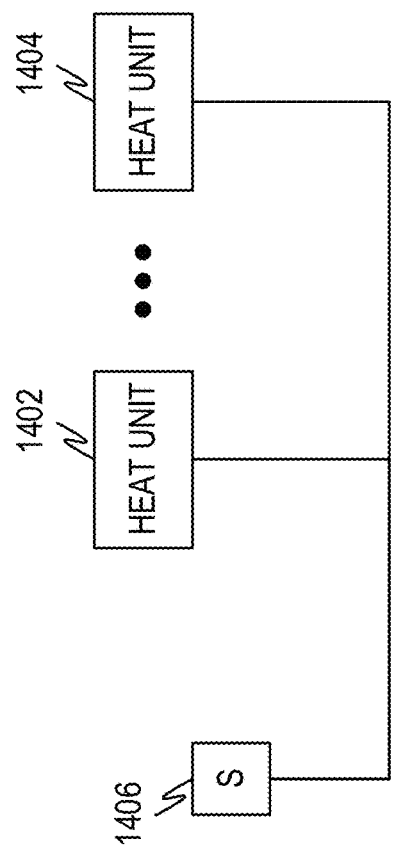
FIG. 14 illustrates an example heating system using in-vent heating systems incorporating solid-state heating elements according to some aspects of the present disclosure.

FIG. 14 illustrates an example heating system using in-vent/in-duct heating systems incorporating solid-state heating elements according to some aspects of the present disclosure. The embodiment, shown generally as 1400, illustrates one example of how in-vent heating systems such as those discussed herein can be incorporated into larger systems.

In this heating system, no central HVAC (heating, ventilation and air condition) system exists. The individual heat units 1402, 1404 represent embodiments such as those in any of FIGS. 9-13. They are, therefore, self-contained units that can be mounted in a room, or other location. In such situations, they can be incorporated into other objects such as white or glass boards, furniture or cabinets, and so forth. Thus, the housings can be shaped to fit any desired shape or application. Because the heating elements discussed herein are able to be formed in any desired shape, the potential designs are virtually unlimited in terms of shape and size.

The heat units 1402, 1404 can include one or more fans, such as previously described, which draw air from the room, from outside, or any other location as desired. As discussed herein, each heat unit 1402, 1404 can comprise one or more sensors, control units, displays, and so forth as previously described. Thus, each heat unit 1402, 1404 can comprise a local thermostat that allows the room or other zone where the heat unit is located to be individually temperature controlled. Additionally, or alternatively, a remote device 1406 can control the temperatures individually or collectively in any combination. For example, each heat unit 1402, 1404 can connect to a home automation system that allows control of the heating units.

The heat units 1402, 1404 can be powered by AC, DC, or a combination thereof as discussed.

The heating elements incorporated into heat units 1402, 1404 can be any of the multilayer heating elements described herein.

Because no ductwork is needed, and because the individual heating units 1402, 1404 can be incorporated into the room in a variety of shapes, sizes, and so forth, such a system is ideal for retrofitting or applications where it is less desirable to run ductwork.

Figure 15:
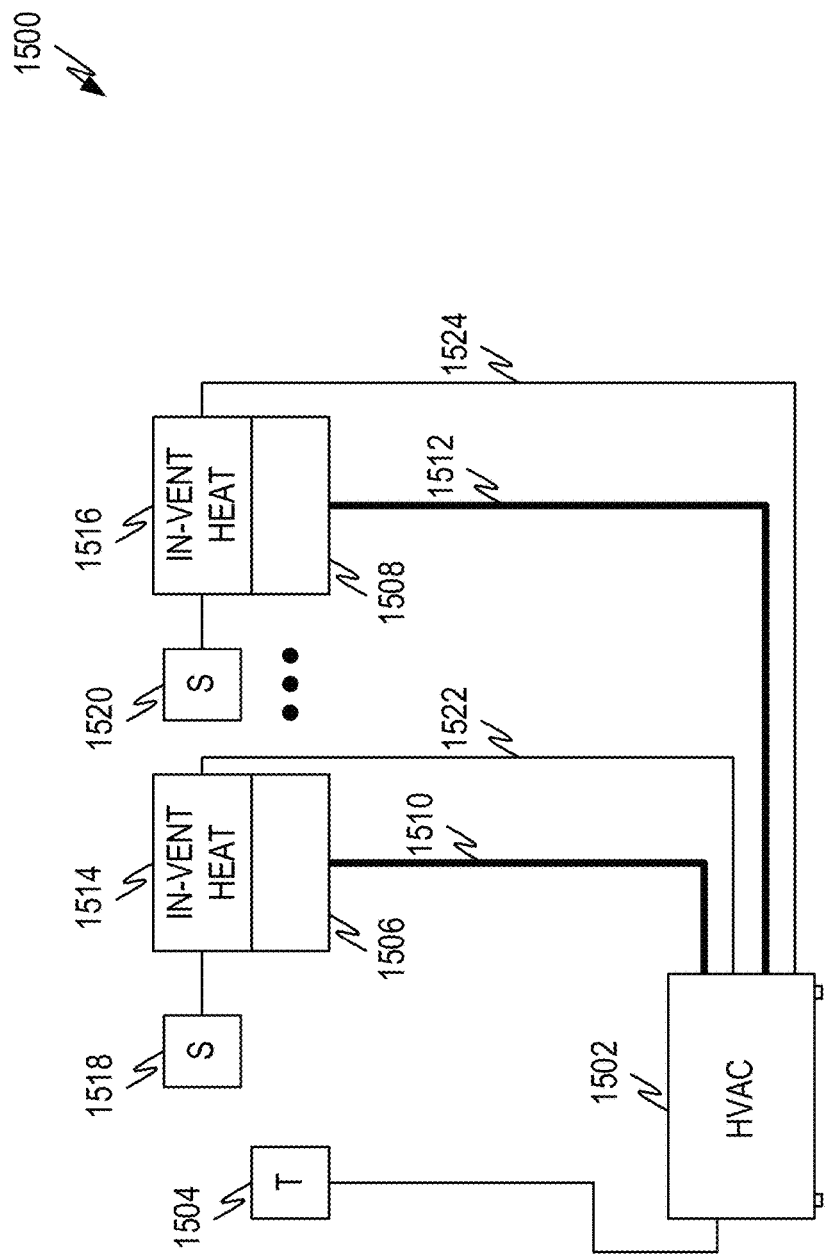
FIG. 15 illustrates an example heating system using in-vent heating systems incorporating solid-state heating elements according to some aspects of the present disclosure.

FIG. 15 illustrates an example heating system using in-vent heating systems incorporating solid-state heating elements according to some aspects of the present disclosure. In the illustrated system, shown generally as 1500, in-vent/in-duct systems 1514, 1516, such as those described herein are shown in conjunction with an HVAC system 1502. Thus, this embodiment illustrates an example of how in-vent/in-duct heat systems 1514, 1516 can be utilized in conjunction with an HVAC system 1502.

HVAC system 1502 can comprise any type of heating system, air handler, or other similar system. For purposes of this discussion an HVAC system 1502 that utilizes air as a heat transfer fluid will be used, although the principles are the same if a boiler or other system that uses liquid as a heat transfer fluid is used.

The HVAC system 1502 produces heat at one or more locations and then utilizes air or another fluid to transfer the heat to an area (room, etc.). HVAC systems 1502 typically have one or more thermostats 1504 that control the HVAC system 1502 and let the HVAC 1502 know when and/or where to deliver heat via a system of ducts 1510, 1512. Thus, when the thermostat(s) call for heat, the HVAC system 1502 turns on a furnace or other heat source and heats air that is then delivered via the ducts 1510, 1512 to the appropriate locations.

The in-vent/in-duct heat systems 1514, 1516 can be located in the ducts and/or duct terminations 1506, 1508 in place of the standard registers typically placed thereat. Alternatively, the in-vent/in-duct heat systems 1514, 1516 can be located between the HVAC system and a standard register. The in-vent/in-duct heat systems 1514, 1516 can comprise one or more local sensors, control systems, and so forth 1518, 1520, as described herein. The sensors/control systems 1518, 1520 control operation of the in-vent/in-duct heat system 1514, 1516 and allow the in-vent/in-duct heat systems 1514, 1516 to operate in conjunction with the HVAC system 1502.

In some embodiments, optional control runs 1522, 1524 can allow the HVAC system 1502 and the in-vent/in-duct systems 1514, 1516 to communicate and coordinate their actions. In these embodiments, the control runs 1522, 1524 can be wired, wireless, or can be made via an automation hub or other mechanism. All that is needed is that information can flow between the HVAC system 1502 and the in-vent/in-duct systems 1514, 1516 in these embodiments.

In other embodiments information does not flow between the HVAC system 1502 and the in-vent/in-duct systems 1514, 1516. In these embodiments, the HVAC system 1502 and the in-vent/in-duct systems 1514, 1516 operate independently, performing their functions based on sensor and other data.

As described herein, one of the problems with a traditional HVAC system 1502 is that when heat is called, the HVAC system 1502 can take some time to begin delivering heat. Modern HVAC systems 1502 pre-heat a heat exchanger before engaging a blower to pass air over the heat exchanger. However, even with pre-heating, the air that exits the register will be below the desired temperature due to the volume of existing (non-heated) air in the ducts, air loss, duct heating, and other factors as discussed herein. This initial quantity of cold air is unavoidable in current systems. The problem only becomes exacerbated in installations where the heat source is a long distance from the duct terminations 1506, 1508, such as in large buildings and many commercial installations.

The addition of in-vent/in-duct systems 1514, 1516 can prevent or reduce this initial cold air problem. For example, when the blower of the HVAC system 1502 begins forcing air out of the ductwork 1510, 1512, the in-vent/in-duct systems 1514, 1516 in the appropriate areas can engage their heating elements. The heating elements can quickly heat the air exiting the ductwork 1510, 1512 and provide warm air to the areas where they are located. When heated air reaches the ductwork termination 1506, 1508, and/or the heated air coming from the ductwork termination 1506, 1508 is at a desired temperature, the in-vent/in-duct systems 1514, 1516 can turn off the heating elements and the air heated by the HVAC system 1502 will pass into the room.

In some embodiments, the in-vent/in-duct systems 1514, 1516 can begin operation by receiving a signal over the control runs 1522, 1524 that heat has been called, and/or the HVAC system has begun its pre-heat cycle, and/or that the HVAC system has engaged its blower. In other embodiments, an airflow sensor (e.g., part of sensors 1518, 1520) detects that air has begun flowing from the HVAC system and/or the thermostat (e.g., 1504 and/or local thermostat that is part of sensors 1518, 1520) has called heat.

The in-vent/in-duct systems 1514, 1516 in conjunction with HVAC system 1502 can enable various scenarios that are not possible with an HVAC system alone. For example, in installations where an HVAC system covers a number of rooms, technology has been developed in an attempt to provide "zones" where the HVAC system can deliver heat to some rooms and not to others. In forced air systems these attempts to zone the HVAC system are often less than satisfactory as they require cutting off airflow to some rooms and allowing heated air to pass into other rooms. Since the HVAC system must be sized to deliver heat to the entire area covered by the HVAC system, it can be somewhat inefficient to heat only a part of the area, even with HVAC systems that modulate heat and/or airflow to reduce the amount of heat delivered.

When in-vent/in-duct systems 1514, 1516 are included with an HVAC system 1502, each room/area covered by the in-vent/in-duct systems 1514, 1516 have a separate heat source as well as the centralized heat source. Thus, control methods can be developed that take into account the entirety of the system, including the in-vent/in-duct systems 1514, 1516.

As an example, consider the situation where the base temperature of the entire area is set to a first temperature, T1. The HVAC system 1502 can be used to deliver heat to all areas until the temperature in the monitored areas reaches T1. At this point, the heat demand will be filled and the HVAC system 1502 will be shut off.

Now suppose that due to one or more factors that one or more areas covered by an in-vent heat system drops in temperature below T1. If the remaining areas covered by the HVAC system 1502 remain at T1 (or at least above the temperature where heat demand would be signaled), rather than starting the HVAC system 1502 to heat the lower temperature areas, a heat demand signal can be sent to the appropriate in-vent heat system(s) and they can be used to raise the temperature in the lower temperature areas back to T1. Thus, those areas of the building that lose heat faster than others can be kept at a desired temperature by using the in-vent/in-duct heat systems 1514, 1516 to increase the temperature in desired areas.

To fulfill the above scenario, a controller (either a centralized controller, or multiple distributed controllers) can measure the temperature in several areas and compare the measured temperature for each area with the corresponding thermostat setting in each area. Each area will have a temperature, $T_{di}$, where the demand for heat will be triggered. Thus, $T_{di}$ is the heat demand temperature $T_d$ for the $i^{th}$ area. When the number of areas calling for heat (e.g., $T_{mi} < T_{di}$, where $T_{mi}$ is the measured temperature for the $i^{th}$ area) is above a threshold number, the HVAC system is triggered to reheat all regions. When the number of areas calling for heat is below a threshold number, then the in-vent system(s) for those areas can be triggered to heat only those areas below the temperature where demand for heat is triggered.

In another example, consider a system where each zone has its own thermostat. In this system, the temperature of the HVAC system 1502 can be set to heat all areas covered by the HVAC system 1502 to the lowest setting of all the thermostats. Then for areas where the thermostats are set higher than the lowest setting, the in-vent heat system(s) can be used to heat the area to the desired temperature.

This scenario can be combined with the previous scenario in some embodiments, such that the embodiments can operate in conjunction with both scenarios.

In these representative scenarios, the HVAC system 1502 is used when heat to all areas covered by the HVAC system 1502 is needed. The in-vent/in-duct systems 1514, 1516 are used when the temperature in local areas covered by those systems needs adjustment.

Example Embodiments

Example 1. A solid state heating element, comprising:
a plurality of heating layers, each heating layer comprising a mixture of carbon and a polymer; and
an insulating layer disposed between the plurality of heating elements.

Example 2. The element of example 1 wherein the insulating layer is substantially transparent to infrared radiation produced by the heating layers.

Example 3. The element of example 1 wherein each heating layer comprises a mixture of graphene powder and a non-conductive binder.

Example 4. The element of example 1 further comprising:
a radiating layer disposed on a first of the plurality of heating layers.

Example 5. The element of example 4 further comprising:
a second radiating layer disposed on a second of the plurality of heating layers.

Example 6. The element of example 1 wherein the polymer comprises polysiloxane and wherein the carbon comprises graphene.

Example 7. The element of example 1 wherein the plurality of heating layers are formed by a single electrically connected layer formed into a three-dimensional structure such that infrared radiation produced by one portion of the single electrically connected layer impinges upon another portion of the single electrically connected layer.

Example 8. The element of example 1 further comprising:
a second insulating layer; and
wherein each heating layer is disposed upon a separate insulating layer.

Example 9. The element of example 1 further comprising:
a supply register or duct section; and
wherein the plurality of heating layers and the insulating layer are disposed within the supply register or duct section such that a fluid passing through the supply register will absorb heat produced by the plurality of heating layers.

Example 10. The element of example 9 further comprising:
a portable power source electrically connected to the plurality of heating elements; and
a fan disposed within the supply register.

Example 11. A system comprising:
a housing;
a heating element disposed within the housing, the heating element comprising:
a plurality of heating layers, each heating layer comprising a mixture of carbon and a polymer or plastic; and
an insulating layer disposed between the plurality of heating elements;
a flow channel surrounding the heating element conducting a heat transfer fluid past the heating element thereby conducting heat from the heating element to the heat transfer fluid; and
a power supply connected to the heating element to cause current to flow within the heating layers of the heating element.

Example 12. The system of example 11 wherein the insulating layer is substantially transparent to infrared radiation produced by the heating layers.

Example 13. The system of example 11 wherein each heating layer comprises a mixture of graphene and a non-conductive binder.

Example 14. The system of example 11 further comprising:
a radiating layer disposed on a first of the plurality of heating layers.

Example 15. The system of example 15 further comprising:
a second radiating layer disposed on a second of the plurality of heating layers.

Example 16. The system of example 15 wherein the radiating layer comprises a metal or polymer foam material.

Example 17. The system of example 11 wherein the heating element further comprises:
a second insulating layer; and
wherein each heating layer is coated on or infused into a separate substrate layer.

Example 18. The system of example 11 wherein the polymer comprises polysiloxane and wherein the carbon comprises graphene.

Example 19. The system of example 11 wherein the housing is sized to fit within a duct of a forced air system.

Example 20. The system of example 11 further comprising a connection to a control system that is also connected to a forced air heating system.

Example 21. A solid state heating element, comprising:
a plurality of heating layers, each heating layer comprising a mixture of carbon and a polymer; and
an insulating layer disposed between the plurality of heating elements.

Example 22. The element of example 21 wherein the insulating layer is substantially transparent to infrared radiation produced by the heating layers.

Example 23. The element of example 21 or 22 wherein each heating layer comprises a mixture of graphene powder and a non-conductive binder.

Example 24. The element of example 23 wherein the carbon comprises graphene and the polymer comprises polysiloxane.

Example 25. The element of example 21, 22, 23, or 24 further comprising:
a radiating layer disposed on a first of the plurality of heating layers.

Example 26. The element of example 25 further comprising:
a second radiating layer disposed on a second of the plurality of heating layers.

Example 7. The element of example 21, 22, 23, 24, 25, or 26 wherein the plurality of heating layers are formed by a single electrically connected layer formed into a three-dimensional structure such that infrared radiation produced by one portion of the single electrically connected layer impinges upon another portion of the single electrically connected layer.

Example 28. The element of example 21, 22, 23, 24, 25, 26, or 27 further comprising:
a second insulating layer; and
wherein each heating layer is disposed upon a separate insulating layer.

Example 29. The element of example 21, 22, 23, 24, 25, 26, 27, or 28 further comprising:
a housing; and
wherein the plurality of heating layers and the insulating layer are disposed within the housing such that a fluid passing through the housing section will absorb heat produced by the plurality of heating layers.

Example 30. The element of example 29 further comprising:
a portable power source electrically connected to the plurality of heating elements; and
a fan disposed within the housing.

Example 31. The element of example 29 or 30 wherein the housing is sized to fit within a duct section.

Example 32. A method to manufacture the apparatus as in any preceding example.

CONCLUSION

In view of the many possible embodiments to which the principles of the present invention and the forgoing examples may be applied, it should be recognized that the examples described herein are meant to be illustrative only and should not be taken as limiting the scope of the present invention. Therefore, the invention as described herein contemplates all such embodiments as may come within the scope of the following claims and any equivalents thereto.

What is claimed is:
1. A solid state heating element, comprising:
a plurality of heating layers, each heating layer comprising a mixture of carbon and a polymer, each heating layer disposed upon a substrate layer; and
the plurality of heating layers oriented to be in close proximity to each other such that infrared radiation produced by one heating layer impinges upon another heating layer.
2. The element of claim 1 further comprising an insulating layer between the plurality of heating layers, the insulating layer substantially transparent to infrared radiation produced by the heating layers such that at least a portion of the infrared radiation produced by one heating layer passes through the insulating layer to impinge upon the other heating layer.

3. The element of claim 1 further comprising:
at least one radiating element or layer dispersing heat created by at least one of the plurality of heating layers.

4. The element of claim 1 wherein the polymer comprises polysiloxane and wherein the carbon comprises graphene.

5. The element of claim 1 wherein the plurality of heating layers are formed by a single heating layer formed into a three-dimensional structure such that infrared radiation produced by one portion of the single electrically connected layer impinges upon another portion of the single electrically connected layer, the single heating layer disposed upon a single substrate layer.

6. The element of claim 2 further comprising:
a second insulating layer; and
wherein the substrate layer comprises an insulating layer and each heating layer is disposed upon a separate insulating layer.

7. The element of claim 1 further comprising:
a supply register or duct section; and
wherein the plurality of heating layers and the insulating layer are disposed within the supply register or duct section such that a fluid passing through the supply register or duct section will absorb heat produced by the plurality of heating layers.

8. The element of claim 7 further comprising:
a portable power source electrically connected to the plurality of heating elements; and
a fan disposed within the supply register.

9. The element of claim 1 wherein close proximity means a distance between the plurality of heating layers is less than ⅛ inch.

10. The element of claim 2 wherein the insulating layer comprises the substrate layer.

11. The element of claim 2 wherein the insulating layer comprises a gap between the heating layers.

12. The element of claim 1 wherein the plurality of heating layers are disposed upon a single substrate layer.

13. The element of claim 1 wherein the plurality of heating layers are disposed upon separate substrate layers.

14. A system comprising:
a housing;
a heating element disposed within the housing, the heating element comprising:
a plurality of heating layers, each heating layer comprising a mixture of carbon and a polymer or plastic;
the plurality of heating layers oriented to be in close proximity to each other such that infrared radiation produced by one heating layer impinges upon another heating layer; and
an insulating layer disposed between the plurality of heating elements;
a flow channel surrounding the heating element conducting a heat transfer fluid past the heating element thereby conducting heat from the heating element to the heat transfer fluid; and
a power supply connected to the heating element to cause current to flow within the heating layers of the heating element.

15. The system of claim 14 wherein the insulating layer is substantially transparent to infrared radiation produced by the heating layers.

16. The system of claim 14 further comprising:
at least one radiating element or layer dispersing heat created by at least one of the plurality of heating layers.

17. The system of claim 16 wherein the radiating layer comprises a metal material or polymer foam material.

18. The system of claim 14 wherein the heating element further comprises:
a second insulating layer; and
wherein each heating layer is coated on or infused into a separate substrate layer.

19. The system of claim 14 wherein the housing is sized to fit within a duct of a forced air system.

20. The system of claim 14 further comprising a connection to a control system that is also connected to a forced air heating system.

* * * * *